(12) United States Patent
Webb et al.

(10) Patent No.: US 7,833,351 B2
(45) Date of Patent: Nov. 16, 2010

(54) BATCH PROCESSING PLATFORM FOR ALD AND CVD

(75) Inventors: Aaron Webb, Austin, TX (US); Adam Brailove, Gloucester, MA (US); Joseph Yudovsky, Campbell, CA (US); Nir Merry, Mountain View, CA (US); Andrew Constant, Cupertino, CA (US); Efrain Quiles, San Jose, CA (US); Michael R. Rice, Pleasanton, CA (US); Gary J. Rosen, San Carlos, CA (US); Vinay K. Shah, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 704 days.

(21) Appl. No.: 11/426,563

(22) Filed: Jun. 26, 2006
(Under 37 CFR 1.47)

(65) Prior Publication Data

US 2007/0295274 A1    Dec. 27, 2007

(51) Int. Cl.
*C23F 1/00*   (2006.01)
*H01L 21/306* (2006.01)
(52) U.S. Cl. ............. 118/719; 156/345.31; 156/345.32; 414/217; 414/940
(58) Field of Classification Search ............ 156/345.31, 156/32; 414/217, 940
See application file for complete search history.

(56) References Cited

U.S. PATENT DOCUMENTS

| | | | |
|---|---|---|---|
| 4,770,590 A | 9/1988 | Hugues et al. | |
| 5,464,453 A | 11/1995 | Tong et al. | |
| 5,562,383 A * | 10/1996 | Iwai et al. | 414/217.1 |
| 5,658,355 A | 8/1997 | Cottevieille et al. | |
| 5,955,215 A | 9/1999 | Kurzweil et al. | |
| 6,066,210 A * | 5/2000 | Yonemitsu et al. | 118/719 |
| 6,174,337 B1 | 1/2001 | Keenan | |
| 6,275,371 B1 | 8/2001 | Yoshio et al. | |
| 6,426,863 B1 | 7/2002 | Munshi | |

(Continued)

OTHER PUBLICATIONS

Burke "Ultracapacitors: Why, How, and Where is the Technology", Institute of Transportation Studies (University of California Davis) Journal of Power Sources 91 (2000) pp. 37-50.

(Continued)

*Primary Examiner*—Michael Cleveland
*Assistant Examiner*—Nathan K Ford
(74) *Attorney, Agent, or Firm*—Patterson & Sheridan, LLP

(57) ABSTRACT

A batch processing platform used for ALD or CVD processing is configured for high throughput and minimal footprint. In one embodiment, the processing platform comprises an atmospheric transfer region, at least one batch processing chamber with a buffer chamber and staging platform, and a transfer robot disposed in the transfer region wherein the transfer robot has at least one substrate transfer arm that comprises multiple substrate handling blades. The platform may include two batch processing chambers configured with a service aisle disposed therebetween to provide necessary service access to the transfer robot and the deposition stations. In another embodiment, the processing platform comprises at least one batch processing chamber, a substrate transfer robot that is adapted to transfer substrates between a FOUP and a processing cassette, and a cassette transfer region containing a cassette handler robot. The cassette handler robot may be a linear actuator or a rotary table.

2 Claims, 21 Drawing Sheets

U.S. PATENT DOCUMENTS

| | | | |
|---|---|---|---|
| 6,493,211 | B1 | 12/2002 | Sugiyama et al. |
| 6,496,357 | B2 | 12/2002 | Lee et al. |
| 6,514,296 | B1 | 2/2003 | Tsai et al. |
| 6,517,691 | B1 * | 2/2003 | Bluck et al. ............ 204/298.25 |
| 6,616,875 | B2 | 9/2003 | Lee et al. |
| 6,632,068 | B2 | 10/2003 | Zinger et al. |
| 6,697,249 | B2 | 2/2004 | Maletin et al. |
| 7,061,749 | B2 | 6/2006 | Liu et al. |
| 2001/0036393 | A1 | 11/2001 | Kroeker |
| 2003/0178142 | A1 * | 9/2003 | de Ridder et al. ....... 156/345.31 |
| 2004/0194706 | A1 * | 10/2004 | Wang et al. ................. 118/722 |
| 2005/0175435 | A1 | 8/2005 | Soraoka et al. |
| 2005/0255717 | A1 | 11/2005 | Takahashi |
| 2006/0134330 | A1 | 6/2006 | Ishikawa et al. |

OTHER PUBLICATIONS

Conway, "The Electrochemical Behavior of Ruthenium Oxide ($RuO^2$) as Material for Electrochemical Capacitors" Electrochemical Supercapacitors Scientific Fundamentals and Technological Applications Chapter 11 pp. 259-297 published 1999 Kluwer Academic.

Conway, Electrochemical Supercapacitors Scientific Fundamentals and Technological Applications Chapters 1 through 7 pp. 1-168 published 1999 Kluwer Academic.

PCT International Search Report and Written Opinion dated Jan. 10, 2008 for International Application No. PCT/US2007/71368.

* cited by examiner

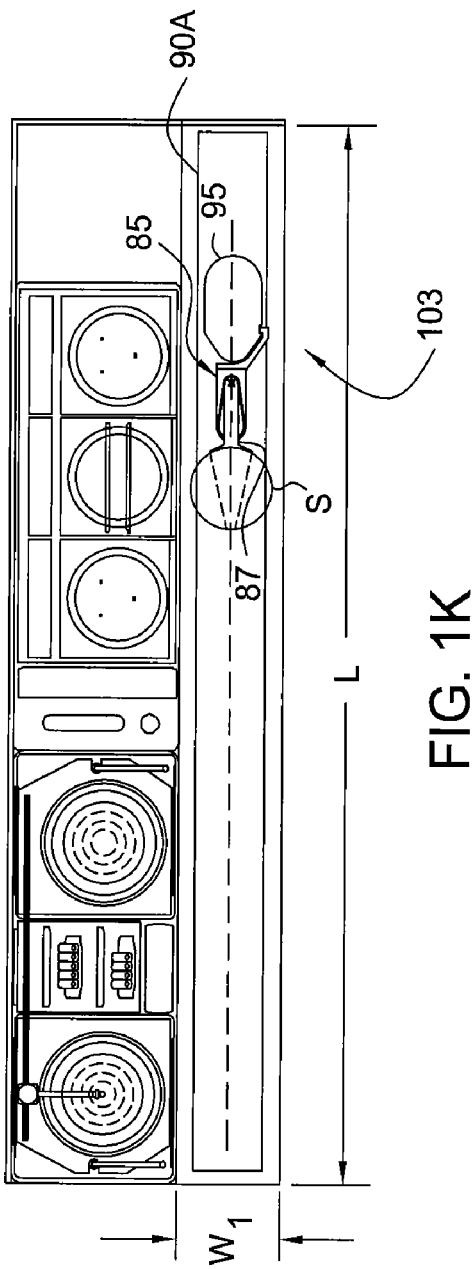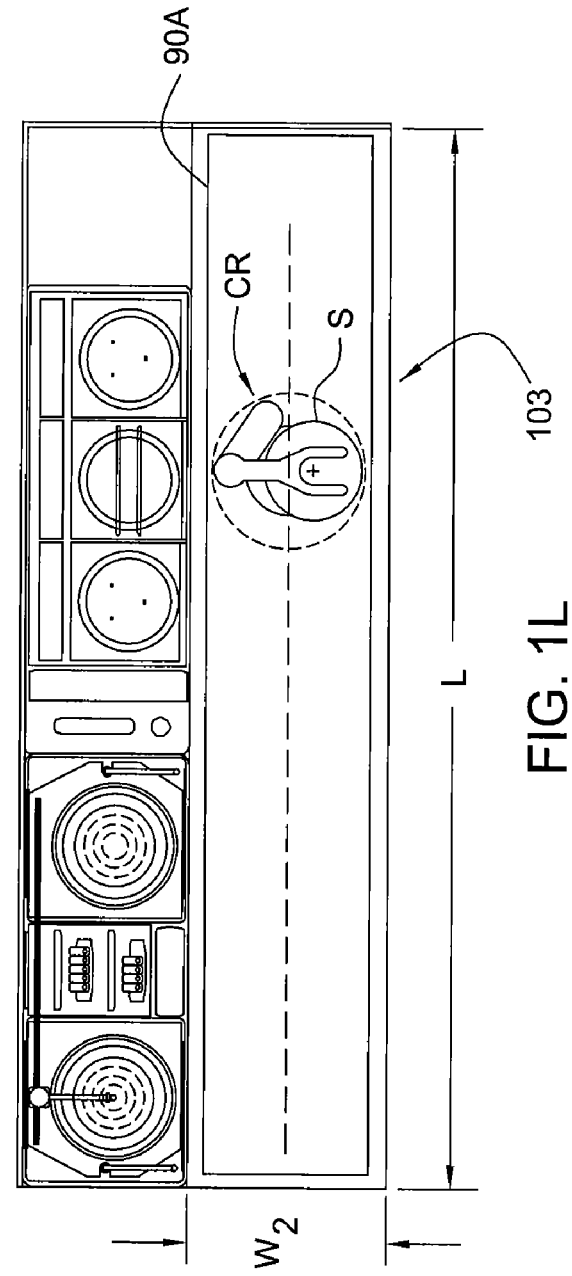

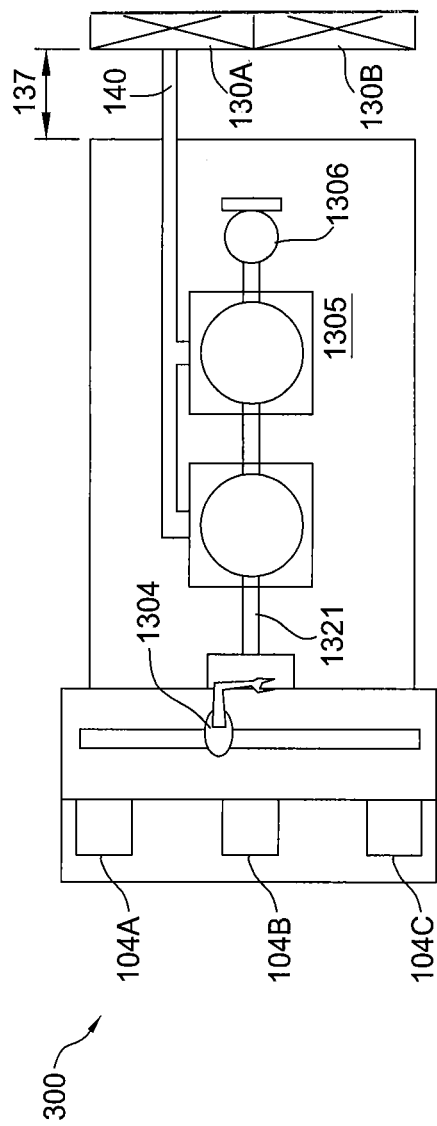
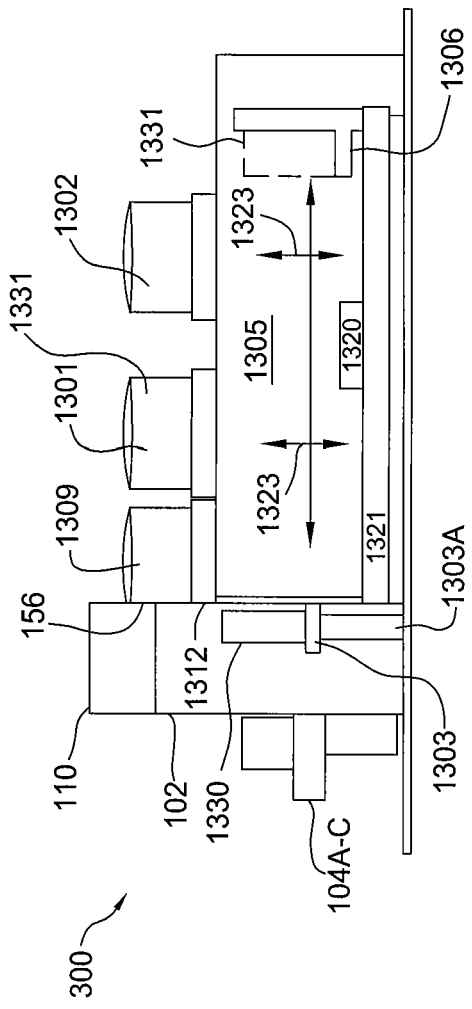
FIG. 3A
FIG. 3B

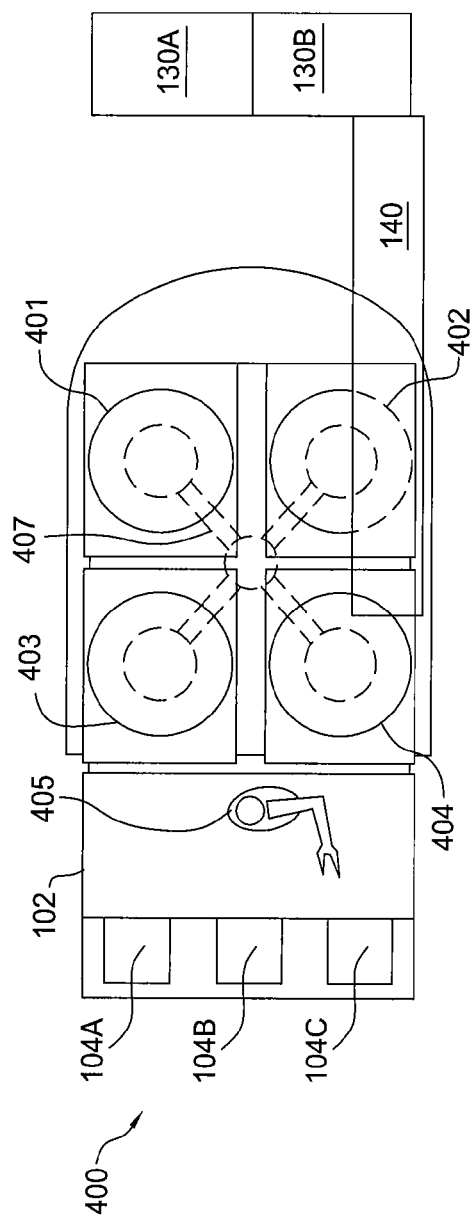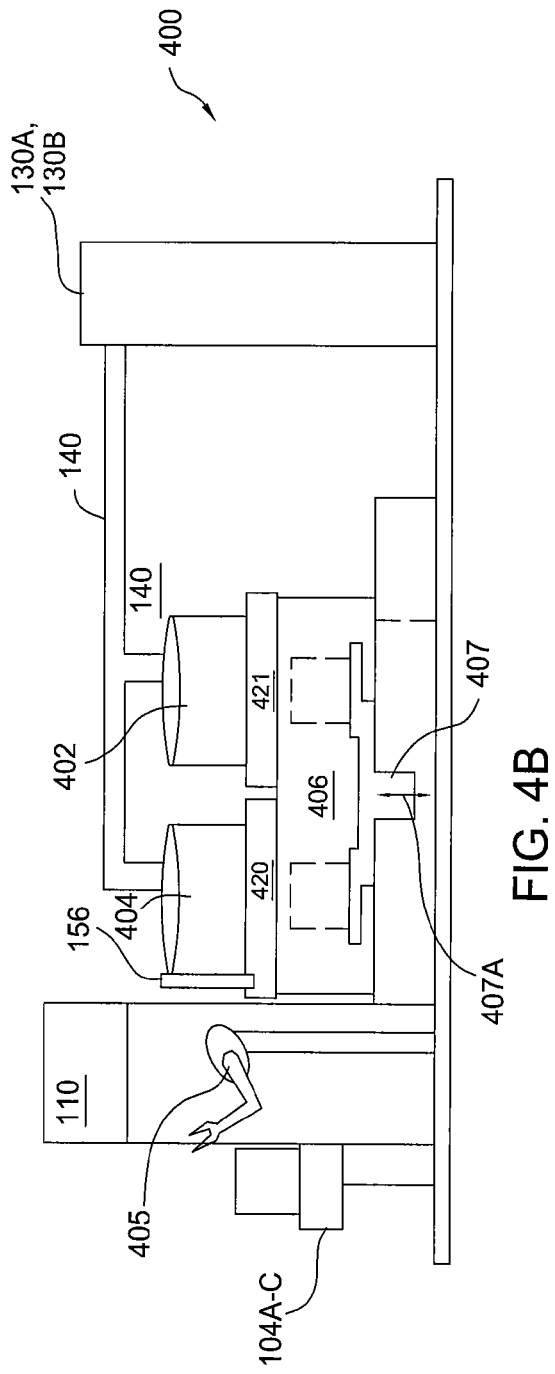
FIG. 4A
FIG. 4B

BATCH PROCESSING PLATFORM FOR ALD AND CVD

BACKGROUND OF THE INVENTION

1. Field of the Invention

Embodiments of the present invention generally relate to an apparatus for processing substrates. More particularly, the invention relates to a batch processing platform for performing atomic layer deposition (ALD) and chemical vapor deposition (CVD) on substrates.

2. Description of the Related Art

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space required to operate the system in a fabrication plant, and system throughput, i.e., the number of substrates processed per hour. Footprint typically includes access areas adjacent the system that are required for maintenance. Hence, although a substrate processing platform may be relatively small, if it requires access from all sides for operation and maintenance, the system's effective footprint may still be prohibitively large.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by alternating the pulsing of an appropriate reactive precursors into a deposition chamber. Each injection of a reactive precursor is typically separated by an inert gas purge to provide a new atomic layer to previous deposited layers to form a uniform layer on the substrate. The cycle is repeated to form the layer to a desired thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. While forced to choose such processes due to device performance requirements, the cost to fabricate the devices in a conventional single substrate processing chamber will increase due to the low substrate throughput. Hence, a batch processing approach is typically taken when implementing such processes to make them economically viable.

Therefore, there is a need for a batch processing platform for ALD and CVD applications wherein throughput is maximized and footprint is minimized.

SUMMARY OF THE INVENTION

Embodiments of the present invention provide a batch processing platform used for ALD or CVD processing of substrates with minimized footprint and high throughput. In one embodiment, the processing platform comprises an atmospheric transfer region, at least one batch processing chamber with a buffer chamber and staging platform, and a transfer robot disposed in the transfer region wherein the transfer robot has at least one substrate transfer arm that comprises multiple substrate handling blades. The transfer robot may be adapted to transfer substrates between a processing cassette and a staging cassette and may further be adapted to be a two bar linkage robot. The platform may include two batch processing chambers configured with a service aisle disposed therebetween to provide necessary service access to the transfer robot and the deposition stations. A fluid delivery system may be in fluid communication with the internal process volume of the at least one batch processing chamber and may be positioned in a facilities tower proximate thereto. A FOUP (Front Opening Uniform Pod) management system may be positioned adjacent the platform.

In another embodiment the processing platform comprises at least one batch processing chamber, a substrate transfer robot that is adapted to transfer substrates between a FOUP and a processing cassette, and a cassette transfer region containing a cassette handler robot. The cassette transfer region may be maintained at atmospheric pressure and the cassette handler robot may be a linear actuator with vertical lift capability or a rotary table. Alternatively, the cassette transfer region may be maintained at a pressure below atmospheric pressure and may further comprise one or more load locks adapted to support the processing cassette proximate the substrate transfer robot. In this aspect, the cassette handler robot may be a linear actuator with vertical lift capability or a rotary table with vertical lift capability. In one configuration, the platform comprises two load locks and two batch processing chambers and the rotary table may be adapted to rotatably position a cassette under each load lock and under each deposition chamber and to vertically transfer cassettes between the cassette transfer region and the deposition chambers and between the cassette transfer region and the load locks. A fluid delivery system may be in fluid communication with the internal process volume of the at least one batch processing chamber and may be positioned in a facilities tower proximate thereto. A FOUP management system may be positioned adjacent the platform.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1K illustrates the clearance region of a Cartesian robot.

FIG. 1L illustrates the clearance region of a conventional robot.

FIG. 1O is a perspective view of a batch processing system with a precursor delivery system positioned on top of the system.

FIG. 3A is a schematic plan view of a batch processing platform.

FIG. 3B is a schematic side view of a batch processing platform.

FIG. 4A is a schematic plan view of a batch processing platform.

FIG. 4B is a schematic side view of a batch processing platform.

DETAILED DESCRIPTION

A batch processing platform for ALD and CVD applications is provided, wherein throughput is maximized and footprint is minimized. In one embodiment, throughput is improved by using a multiple arm robot to transfer substrates. In another embodiment, a cassette handler robot is used to transfer entire cassettes to improve throughput.

Multiple Arm Robot Platform

In this embodiment, a robot with multiple arms transfers substrates between a staging cassette and a processing cassette using an arm configured with multiple blades to reduce transfer times therebetween. Because a processing chamber is idle during substrate transfers, it is beneficial for system throughput to minimize the time required for transferring substrates into and out of a processing cassette. The robot also transfers substrates between a substrate transport pod and the staging cassette using another arm configured with a single blade to accommodate the difference in substrate spacing between the pod and the staging cassette. Configurations include a Cartesian robot-based platform as well as a configuration with two batch processing chambers and a common access space therebetween that allows all components of the platform to be accessed for maintenance without side access to the platform.

Figure 1A:
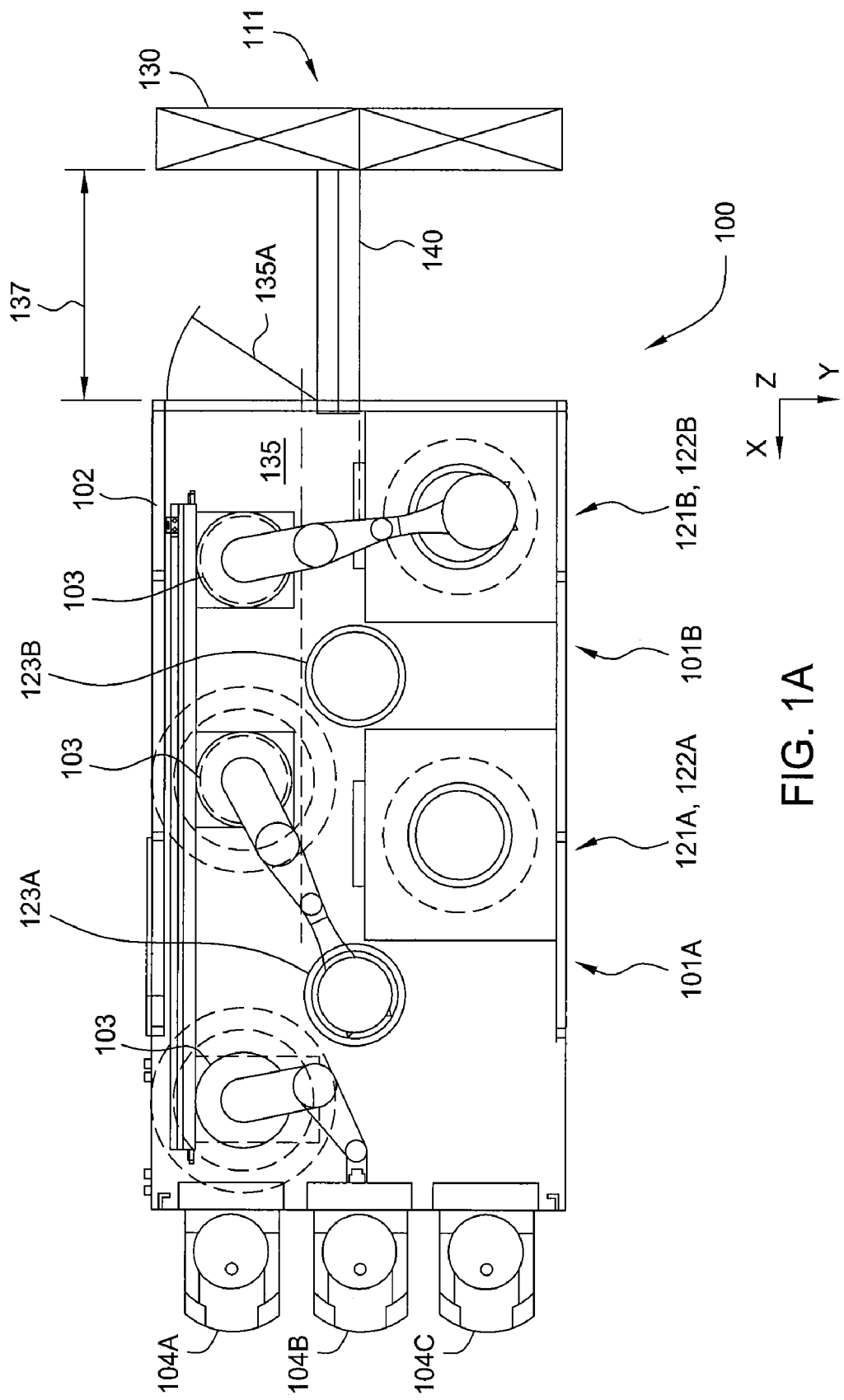
FIG. 1A is a schematic plan view of a batch processing platform that uses a multiple arm robot for substrate transfers.

FIG. 1A is a schematic plan view of one aspect of the invention, a batch processing platform using a multiple arm robot for substrate transfers, hereinafter referred to as system 100. System 100 includes one or more batch processing stations 110A, 101B, a system controller 111, a factory interface (FI) 102, containing a transfer robot assembly 103 and one or more load stations 104A-C, and a process fluid delivery system, which may be contained in a facilities tower 130. For illustrative purposes, transfer robot assembly 103 is illustrated in three positions simultaneously, i.e., adjacent load stations 104A-C, adjacent reactor 121A and adjacent reactor 121B. The batch processing stations 101A, 101B are disposed adjacent FI 102 and proximate each other to minimize the overall footprint of batch processing platform 100 and the distance necessary for transfer robot assembly 103 to travel when transferring substrates between load stations 104A-C and batch processing stations 101A, 101B. Two batch processing stations 101A, 101B are illustrated in FIG. 1A, however additional stations may be added easily. A facilities tower 130 may be positioned a service distance 137 from batch processing station 101B and FI 102 and may be connected to other components of system 100 via an overhead rack 140. Service distance 137 allows access door 135A to be opened for servicing transfer robot assembly 103.

Batch processing stations 101A, 101B may be configured to perform the same batch process simultaneously on different groups of substrates, or they may be configured to perform two different batch processes sequentially on the same group of substrates. In the former configuration, the starting time for substrate processing in each batch processing station may be staged, i.e., alternated, to minimize idle time associated with the transfer of substrates to and from batch processing stations 101A, 101B; transfer robot assembly 103 is only required to load and unload one batch processing station at a time. In the latter configuration, a group of substrates undergoes a first batch process in one batch processing station and then undergoes a second batch process in the other batch processing station. Alternatively, system 100 may be configured with a combination of batch processing stations and single-substrate processing stations. This configuration of system 100 is particularly useful when an unstable batch film requires some form of post-processing, such as a capping process, since the batch-processed substrates may immediately undergo the desired post-processing.

In general operation, substrates are typically transported to system 100 in FOUP's, that are positioned on the load stations 104A-C. Transfer robot assembly 103 may transfer a first batch of substrates to a staging cassette adjacent the batch processing station while the batch processing station is processing a second batch of substrates in a processing cassette.

Transfer robot assembly 103 may perform the transfer between FOUP's and staging platforms with a robot arm configured with a single blade. After processing, substrates may be swapped between the staging cassette and the desired processing cassette by transfer robot assembly 103 using a robot arm configured with multiple blades. If any single-substrate processing chambers are present on system 100, transfer robot assembly 103 transfers substrates between the single-substrate processing chambers and the appropriate staging platform using a robot arm configured with a single blade.

In a configuration of system 100 in which sequential batch processes are performed on the same group of substrates, substrates may be transferred to a batch processing station from a first staging cassette prior to processing and then transferred to a second staging cassette after processing. For example, transfer robot assembly 103 may transfer a group of substrates from a staging cassette 123A to batch processing station 101A for a first batch process. Upon completion of the first batch process, transfer robot assembly 103 transfers the group of substrates from batch processing station 101A to staging cassette 123B. When batch processing station 101B is available for processing, transfer robot assembly 103 then transfers the group of substrates from staging cassette 123B to batch processing station 101B for the second batch process. As noted above, a robot arm configured with multiple blades is used for transfers between staging cassettes and batch processing stations, since there is no difference in substrate spacing therebetween.

Batch Processing Stations

Figure 1B:
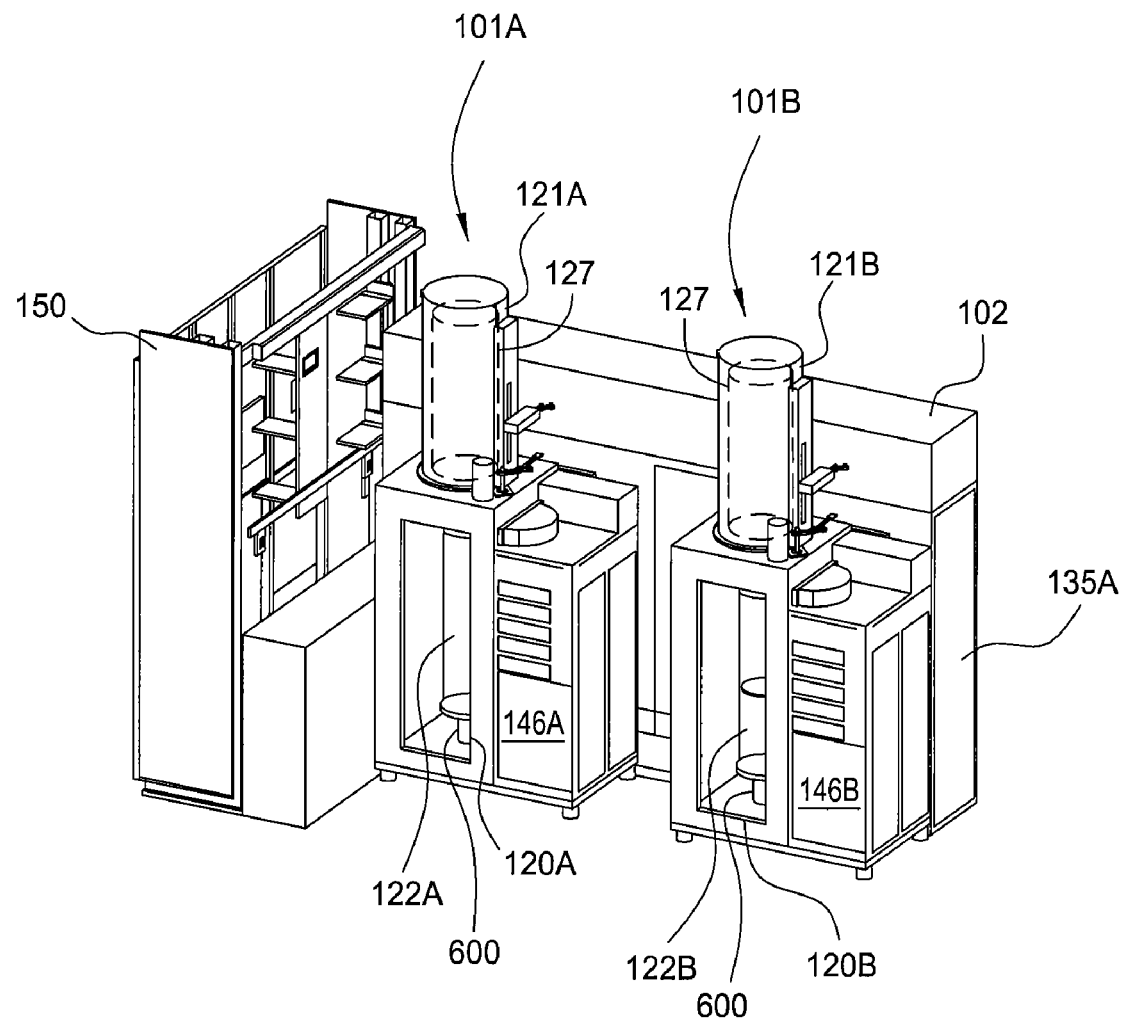
FIG. 1B is a perspective view of the batch processing system of FIG. 1A.

FIG. 1B is a perspective view of system 100 with access panels 120A, 120B and facilities tower 130 removed for clarity. Referring to FIGS. 1A and 1B, batch processing station 101A includes a reactor 121A, containing an internal process volume 127, a buffer chamber 122A positioned adjacent reactor 121A, and a staging platform 123A adapted to support a staging cassette (not shown) proximate batch processing chamber 121A. Similarly, batch processing station 101B includes a reactor 121B, a buffer chamber 122B, and a staging platform 123B adapted to support a staging cassette (not shown) proximate batch processing chamber 121B.

Figure 1C:
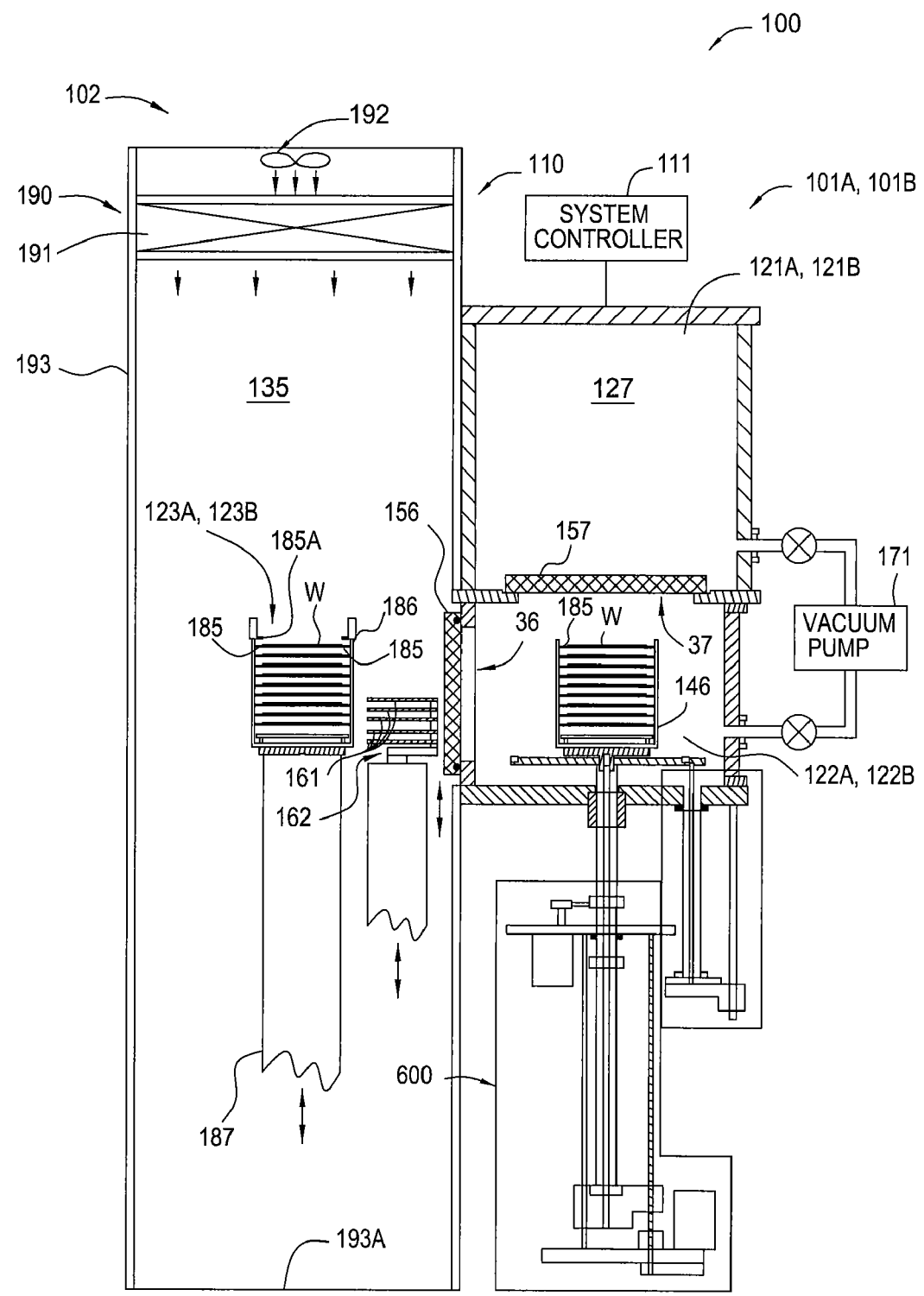
FIG. 1C is a schematic vertical cross-sectional view of a batch processing system illustrating the factory interface, reactors, buffer chambers, and staging platforms.

FIG. 1C is a schematic vertical cross-sectional view of system 100 illustrating FI 102, reactors 121A, 121B, buffer chambers 122A, 122B, and staging platforms 123A, 123B. Preferably, and as illustrated in FIGS. 1B and 1C, buffer chambers 122A, 122B are not only adjacent to, but also vertically aligned with reactors 121A, 121B, respectively, minimizing the footprint of batch system 100. In the configuration illustrated in FIGS. 1B, 1C, buffer chambers 122A, 122B are positioned directly below reactors 121A, 121B, respectively. Buffer chambers 122A, 122B are adapted to act as vacuum load locks for the loading and unloading of a processing cassette 146 into and out of reactors 121A, 121B, respectively. Buffer chambers 122A, 122B are fluidly coupled to a vacuum source. The vacuum source may be a remote vacuum source or a vacuum pump 171 contained inside system 100. It is important to minimize the time required for pumping down and venting buffer chambers 122A, 122B, because reactors 121A, 121B are idle during buffer chamber pumping and venting. To that end, buffer chambers 122A, 122B are further adapted to contain the minimum volume necessary to contain the processing cassette in order to speed the pumping and venting process. For example, for a processing cassette adapted to support circular substrates in a vertically aligned column, buffer chambers 122A, 122B are preferably configured as cylindrical chambers with a minimal vertical clearance above and below the processing cassette and with a minimal radial clearance around the processing cassette and substrates therein, as depicted in FIG. 1B. Buffer chambers 122A, 122B both further include a lift mechanism 600, transfer openings 36, 37, and vacuum-tight doors 156, 157. Lift mechanism 600 may be pneumatic actuator, a stepper motor, or other vertical actuators known in the art.

In operation, processing cassette 146 is loaded with substrates W from staging cassette 186 via transfer robot assembly 103 while a buffer chamber (in this example, buffer chamber 122A) is vented to atmosphere and transfer opening 36 is open to transfer region 135. For clarity, only one robot arm 162, which is configured with five blades 161 is illustrated in FIG. 1C. The substrate loading/unloading process is described below in conjunction with FIGS. 1F-1I. Vacuum-tight door 156 is closed and buffer chamber 122A is pumped down to the same level of vacuum present in process volume 127, generally between about 0.5 and 20 Torr. Vacuum-tight door 157 is then opened and lift mechanism 600 transfers processing cassette 146 into process volume 127 for ALD or CVD processing of substrates W. For some ALD and CVD processes, it is desirable to pressure cycle substrates W in buffer chamber 122A, i.e., buffer chamber 122A is alternately pumped down to process pressure and vented with a very dry gas to remove residual moisture adsorbed onto the surfaces of substrates W and processing cassette 146. In one configuration, lift mechanism 600 lowers back to buffer chamber 122A and vacuum-tight door 157 closes during processing in process volume 127. After processing is complete, lift mechanism 600 transfers processing cassette 146 back to buffer chamber 122A and vacuum-tight door 157 closes, isolating process volume 127 from buffer chamber 122A. Buffer chamber 122A is then vented to atmospheric pressure and substrates W are transferred to staging cassette 186 for cooling and subsequent removal from system 100.

Isolating process volume 127 from buffer chamber 122A with vacuum-tight door 157 while transferring substrates W to staging cassette 186 allows process volume 127 to remain as close as possible to process temperature and pressure between batches of substrates. This is beneficial to process repeatability and throughput since little time is required for process conditions in process volume 127 to stabilize to desired conditions. Process volume 127 for batch processing chambers may be relatively large to accommodate a typical processing cassette 146, for example, on the order of 1 m in height. Because of this, stabilization of the pressure and temperature in process volume 127 can be time-consuming after being vented to atmospheric pressure. Hence, chamber idle time—in this case stabilization time—is reduced significantly by isolating process volume 127 during substrate transfers between processing cassette 146 and staging cassette 186. In addition, fewer contaminants are able to enter process volume 127 as a result of transferring processing cassette 146 between buffer chamber 122A and reactor 121A.

In one configuration, lift mechanism 600 may also be adapted to assist in servicing the reactor. Referring to FIG. 1B, lift mechanism 600 may be used to lower difficult-to-access components of reactor 121A into buffer chamber 122A for easy removal from access panel 120A. Improved serviceability reduces system downtime during maintenance procedures, improving COO.

Reactors 121A, 121B are adapted to perform a CVD and/or an ALD process on substrates W supported on a processing cassette 146 and contained therein. A more detailed description of an ALD or CVD reactor that may be contained in some configurations of the invention may be found in commonly assigned U.S. patent application Ser. No. 11/286,063, filed on Nov. 22, 2005, which is hereby incorporated by reference in its entirety to the extent not inconsistent with the claimed invention. Reactors 121A, 121B are fluidly coupled to a process fluid delivery system that is adapted to provide the necessary appropriate reactive precursor and other process fluids. Preferably, the process fluid delivery system is contained in a facilities tower 130 and coupled to reactors 121A, 121B via an overhead rack 140, illustrated in FIG. 1A. Facilities tower 130 is described below in conjunction with FIG. 1N. Electrical and other facilities, such as system controller 111 may also be located in facilities tower 130. Alternatively, the fluid delivery system may be positioned remotely in another area of the fabrication plant and may be fluidly coupled to reactors 121A, 121B via underfloor connections (not shown).

Referring to FIG. 1C, staging platforms 123A, 123B are positioned in FI 102 and are each adapted to support a staging cassette 186 proximate reactors 121A, 121B, respectively. Typically, substrates are supported in a sealable substrate transport pod, hereinafter referred to as a front-opening uniform pod (FOUP), at a lower density than during batch processing in an ALD or CVD chamber, i.e., there is a 10 mm substrate-to-substrate spacing in a FOUP vs. a 6 mm to 8 mm spacing in a processing cassette 146. It is important to note that a staging cassette 186 supported proximate a batch processing chamber may be adapted to support substrates at the identical substrate density at which substrates are supported in a processing cassette 146, providing substantial throughput and cost benefits. For example, a simple single blade robot arm, such as that described below in conjunction with FIG. 1G, may be used to transfer substrates between staging cassettes 123A, 123B and load stations 104A-C. Although transferring substrates therebetween with a multiple blade robot arm is faster that with a single blade robot arm, there is generally no throughput gain over single blade transfer of substrates. This is because substrate transfers between staging cassettes 123A, 123B and load stations 104A-C may take place "off-line", i.e., while reactors 121A, 121B are processing substrates. Transfer times that directly affect system throughput are those between staging platforms 123A, 123B and buffer chambers 122A, 122B, as described above in conjunction with FIGS. 1A-C.

Figure 1D:
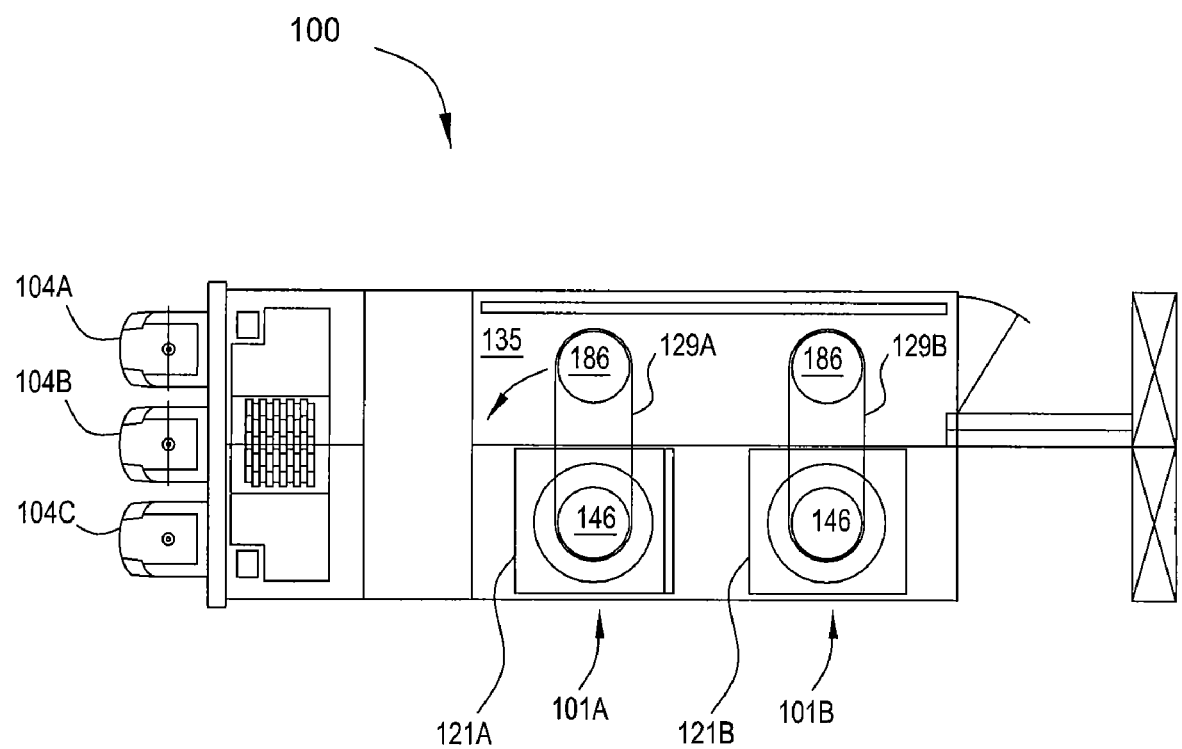
FIG. 1D illustrates a schematic plan view of a batch processing system configured with two batch processing stations, each served by a two-cassette rotary table.

Because staging cassette 186 may be adapted to support substrates at the identical substrate density at which substrates are supported in processing cassette 146, substrate transfers may be conducted therebetween with a multiple blade, fixed pitch robot, such as that described below in conjunction with FIG. 1I. Multiple blade robots greatly reduce substrate transfer time since multiple substrates may be transferred at one time. System throughput may be improved significantly thereby, since shorter transfer times reduce reactor idle time.

Staging cassette 186 and processing cassette 146 may be adapted to support a relatively large number of substrates, i.e., more than are typically contained in a standard FOUP. Because some processes, e.g., ALD processes, are so time consuming, it is beneficial for COO for as many substrates as practicable to be processed in a single batch. Hence, staging cassette 186 and processing cassette 146 are preferably adapted to support a batch of between about 50 and about 100 substrates. Larger batches are also possible, but the manipulation of cassettes so large in a reliable and safe manner becomes increasingly problematic. Processing cassette 146 may be constructed of any suitable high temperature material such as, for instance, quartz, silicon carbide, or graphite, depending upon desired process characteristics Staging platforms 123A, 123B may also serve as cooling platforms on which substrates may cool after unloading from reactors 121A, 121B. Typically, substrates unloaded from ALD and CVD chambers are too hot (i.e., >100° C.) to be loaded directly into a standard FOUP. Staging platforms 123A, 123B may also be adapted with a conventional robot vertical motion assembly 187, as shown in FIG. 1C. To minimize the complexity of system 100, it is preferred that staging platforms 123A, 123B are stationary components and the vertical motion required for substrate hand-offs is carried out by transfer robot assembly 103.

In one configuration of system 100, a staging cassette 186 that is supported on staging platforms 123A, 123B may contain more substrate support shelves 185 than processing cassette 146 disposed in buffer chambers 122A, 122B. This allows substrates to be swapped between staging cassette 186 and processing cassette 146 without the use of a third substrate staging location and without the use of an additional transfer robot assembly, such as second transfer robot 86B (described below in conjunction with FIG. 1H). For example, referring to FIG. 1C, processing cassette 146 has nine substrate support shelves 185 and staging cassette 186 has nine support shelves 185 plus one or more additional shelves 185A. Hence, transfer robot assembly 103 may remove a processed substrate W from processing cassette 146 and place it in the unused additional shelf 185A. An unprocessed substrate is then removed from staging cassette 186 by transfer robot assembly 103 to the now empty support shelf 185 in processing cassette 146, leaving one of support shelves 185 open in staging cassette 186. The above process may then be repeated until all substrates originally in processing cassette 146 have been swapped with the substrates originally in staging cassette 186. In a similar configuration, when transfer robot assembly 103 includes a multi-blade robot arm (described below in conjunction with FIG. 1I) for transferring substrates between staging cassette 186 and processing cassette 146, it is preferred that the number of additional shelves 185A is equal to the number of blades on the multi-blade robot arm of transfer robot assembly 103. This allows the same substrate swap procedure described above, but with multiple substrates being swapped at one time.

In another configuration of system 100, staging cassette 186 may contain multiple additional shelves 185A for supporting dummy substrates, i.e., non-production substrates, during batch processing. Due to thermal non-uniformity and other factors, substrates near the top and bottom of a processing cassette are often not processed uniformly compared to the majority of substrates in the processing cassette. The placement of one or more dummy substrates in the top and bottom substrate support shelves of a processing cassette may ameliorate this problem. The non-production dummy substrates are placed in the top 1 to 5 substrate support shelves 185 and the bottom 1 to 5 support shelves 185 of processing cassette 146. Dummy substrates may be used for multiple batch processes, e.g., about 5 or 10 times, before being replaced, and therefore do not need to be removed from system 100 after each batch process is performed. To reduce the time required to reload dummy substrates into processing cassettes, aspects of the invention contemplate the storage of dummy substrates on additional shelves 185A contained in staging cassette 186. Hence, dummy substrates are stored in transfer region 135 in proximity to the batch processing stations 101A, 101B, whenever batch processes are not being performed therein. In addition to reducing the time required to load dummy substrates into a processing cassette, storage of dummy substrates on additional shelves 185A reduces the number of FOUP's that need to be stored in the stocker 150 (shown in FIG. 1B and described below in conjunction with FIGS. 1P and 1Q).

In one configuration, staging platforms 123A, 123B are each adapted to serve as a two-cassette rotary table for rotatably swapping a first processing cassette of unprocessed substrates with a second processing cassette processed substrates. FIG. 1D illustrates a schematic plan view of system 100 configured with two batch processing stations 101A, 101B, each served by a two-cassette rotary table 129A, 129B, respectively. In this configuration, staging cassette 186 acts as the second processing cassette.

While a batch of substrates in processing cassette 146 are being processed in the reactor 121A of batch processing station 101A, staging cassette 186 is being loaded with substrates from load stations 104A-C. After processing is complete in reactor 121A, processing cassette 146 is lowered onto rotary table 129A by a lift mechanism (not shown for clarity). Rotary table 129A then rotates 180°, swapping the locations of processing cassette 146 and staging cassette 186. The processed substrates cool in transfer region 135 and are then transferred to one or more FOUP's positioned on load stations 104A-C. Simultaneously, the lift mechanism transfers staging cassette 186 into reactor 121A for processing. Hence, no significant length of time is required to transfer substrates from transfer region 135 to reactor 121A. Rather than transferring individual substrates between a staging cassette and a processing cassette, in this configuration of system 100 the staging and processing cassettes are simply swapped by rotary table 129A. In one example, the batch processing stations 101A, 101B each include a buffer chamber for isolating reactors 121A, 121B as described above in conjunction with FIG. 1D.

Figure 1E:
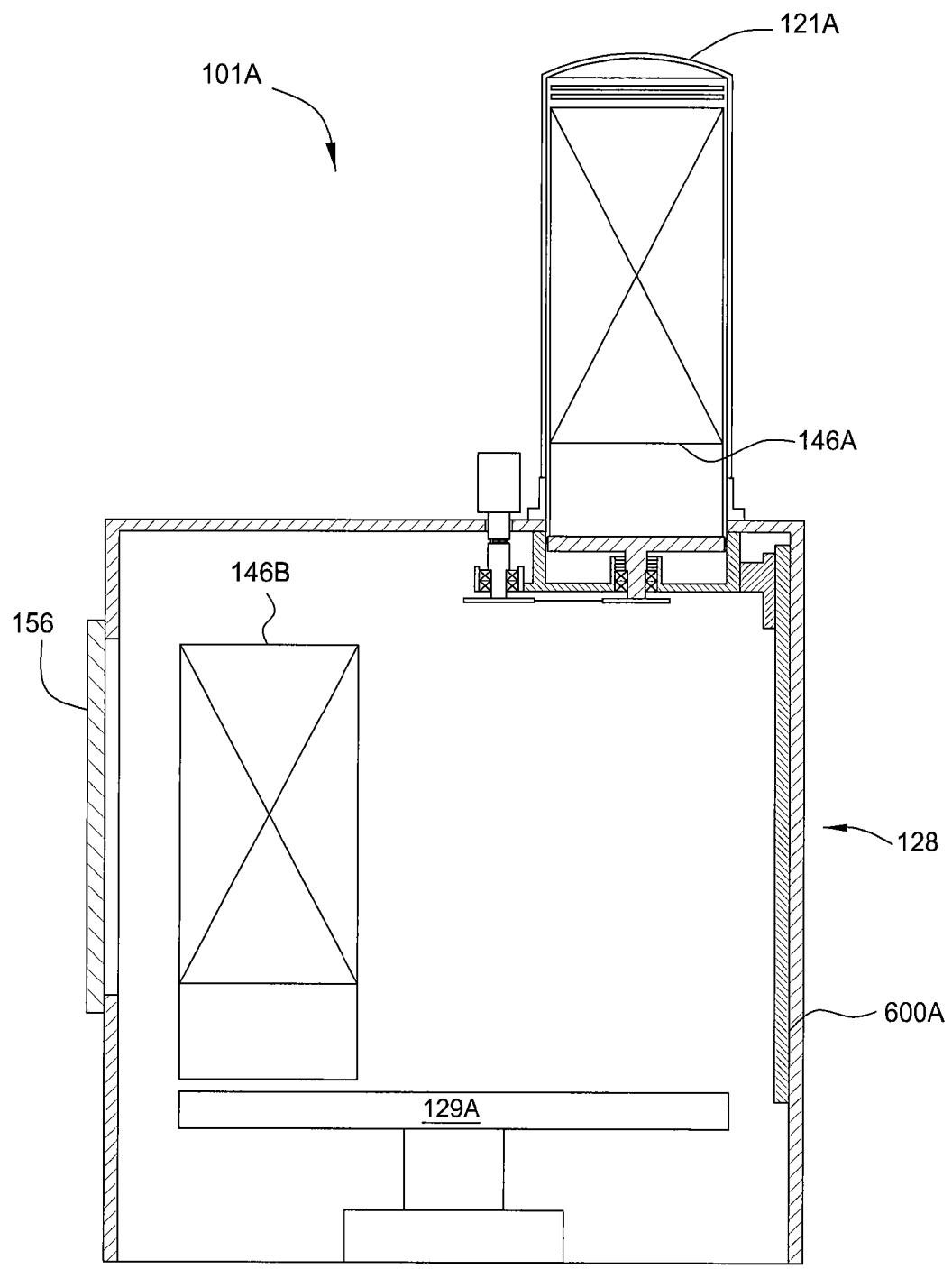
FIG. 1E is a cross-sectional side view of a batch processing station.

In another configuration, rotary tables 129A, 129B are each contained in a buffer chamber 128, as illustrated in FIG. 1E. FIG. 1E is a cross-sectional side view of a batch processing station 101A which includes a reactor 121A containing a processing cassette 146A and a buffer chamber 128 containing a two-cassette rotary table 129A and a second processing cassette 146B. A lift mechanism 600A, in this case a vertical indexer robot, transfers cassettes between rotary table 129A and reactor 121A. During processing of processing cassette 146A, buffer chamber 128 is vented to atmospheric pressure and a vacuum-tight door 156 opens to provide access to second processing cassette 146B from transfer robot assembly 103. After second processing cassette 146B is loaded with substrates, vacuum-tight door 156 is closed and buffer chamber 128 is vented or pressure cycled in preparation for swapping second processing cassette 146B with processing cassette 146A. This configuration allows the speedy reloading of reactor 121A with a processing cassette, minimizing reactor downtime. All pump-down and venting of buffer chamber 128 take place while substrates are being processed in reactor 121A.

Factory Interface

Referring back to FIG. 1C, the factory interface (FI) 102, contains a transfer robot assembly 103, a transfer region 135, an environmental control assembly 110 and one or more load stations 104A-C (shown in FIG. 1A). FI 102 maintains transfer region 135 as a clean mini-environment, i.e., a localized, atmospheric pressure, low-contaminant environment, via a fan-powered air filtration unit. FI 102 is intended to provide a clean environment, i.e., transfer region 135, in which a substrate may be transferred between a FOUP positioned on any of load stations 104A-C and reactors 121A, 121B. Recently processed substrates are also able to cool after processing in the low-contamination environment of transfer region 135 prior to being transferred out of system 100 and into a FOUP.

FIG. 1C is a schematic vertical cross-sectional view of system 100 illustrating FI 102, reactors 121A, 121B, buffer chambers 122A, 122B, and staging platforms 123A, 123B. For clarity, load stations 104A-C are not shown. In one aspect, environmental control assembly 110 contains a filtration unit 190 that may contain a filter 191, such as a HEPA filter, and a fan unit 192. The fan unit 192 is adapted to push air through the filter 191, through transfer region 135, and out the base 193A of the FI 102. FI 102 includes walls 193 to enclose transfer region 135 to better provide a controlled environment to perform the substrate processing steps. Generally the environmental control assembly 110 is adapted to control the air flow rate, flow regime (e.g., laminar or turbulent flow) and particulate contamination levels in the transfer region 135. In one aspect, the environmental control assembly 110 may also control the air temperature, relative humidity, the amount of static charge in the air and other typical processing parameters that can be controlled by use of conventional clean room compatible heating, ventilation, and air conditioning (HVAC) systems known in the art.

Load stations 104A-C are adapted to support, open, and close a FOUP or other sealable substrate transport pod placed thereon. Hence, load stations 104A-C fluidly couple substrates contained in a load station-supported FOUP to transfer region 135 without exposing the substrates to contaminants that may be present outside the FOUP and/or transfer region 135. This allows substrates to be removed, replaced, and resealed in a FOUP in a clean and fully automated manner.

Cartesian Robot

Figure 1F:
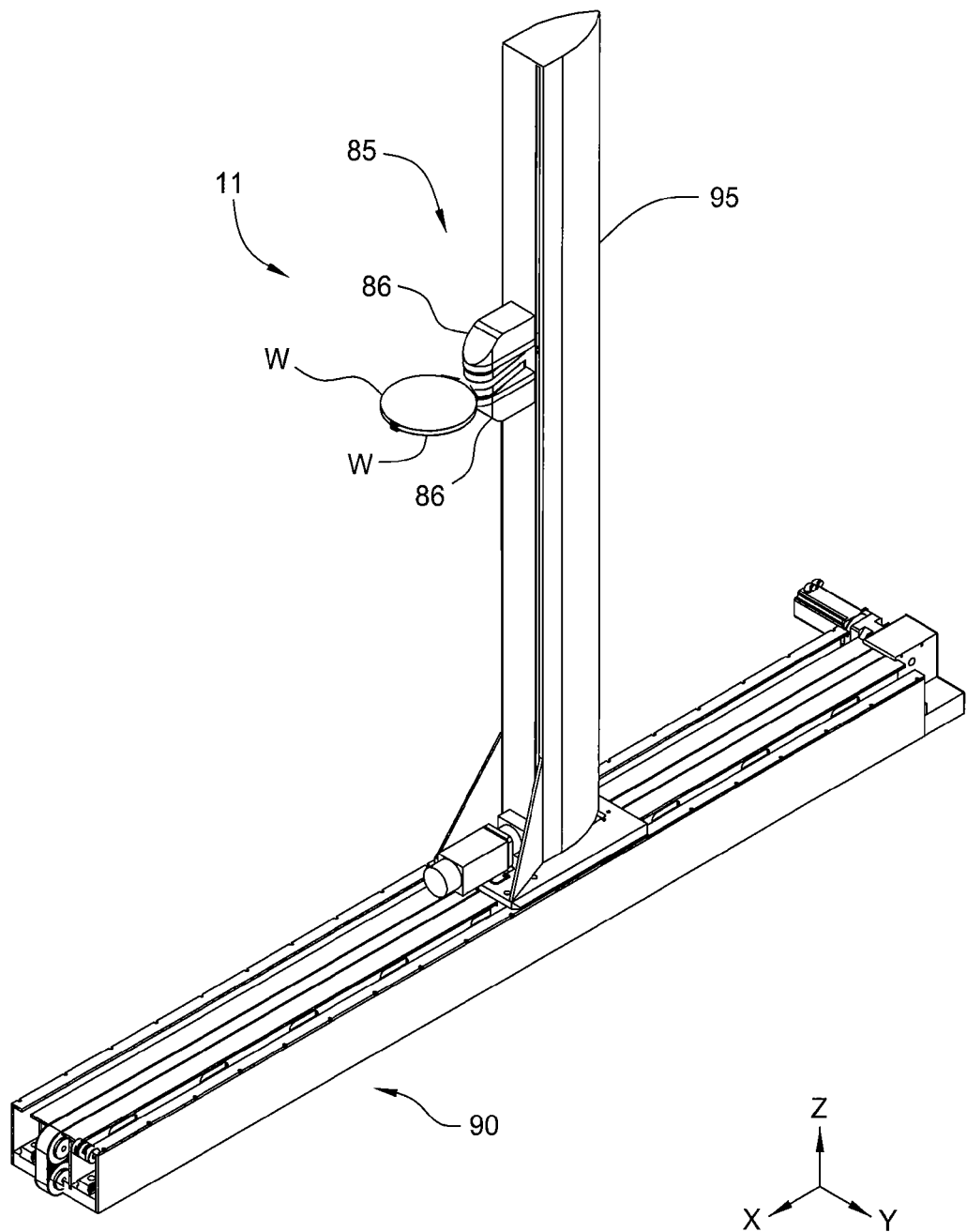
FIG. 1F illustrates one configuration of a robot assembly that may be used in a factory interface.

FIG. 1F illustrates one configuration of a robot assembly 11 that may be used as transfer robot assembly 103 in FI 102. The robot assembly 11 generally contains a robot hardware assembly 85, a vertical robot assembly 95 and a horizontal robot assembly 90. A substrate can thus be positioned in any desired x, y and z position in the transfer region 135 by the cooperative motion of the robot hardware assemblies 85, vertical robot assembly 95 and horizontal robot assembly 90, from commands sent by the system controller 111.

The robot hardware assembly 85 generally contains one or more transfer robots 86 that are adapted to retain, transfer and position one or more substrates by use of commands sent from the system controller 111. In the configuration depicted in FIG. 1F, two transfer robots 86 are included in robot hardware assembly 85. In a preferred configuration, the transfer robots 86 are adapted to transfer substrates in a horizontal plane, such as a plane that includes the X and Y directions illustrated in FIGS. 1A and 1F, due to the motion of the various transfer robot 86 components. Hence, the transfer robots 86 are adapted to transfer a substrate in a plane that is generally parallel to the substrate supporting surface 87C (see FIG. 1M) of robot blade 87. The operation of one configuration of transfer robots 86 is described below in conjunction with FIG. 1M.

Figure 1G:
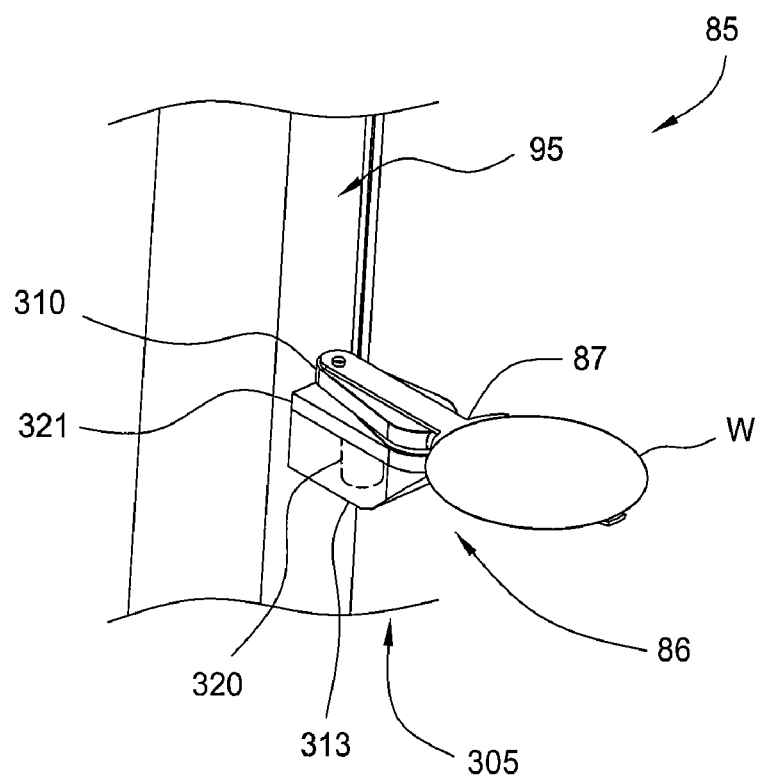
FIG. 1G illustrates a configuration of a robot hardware assembly containing a transfer robot that may be adapted to transfer a single substrate at a time.

FIG. 1G illustrates a configuration of robot hardware assembly 85 containing a transfer robot 86 that may be adapted to transfer a single substrate W at a time. A single substrate transfer capability for transfer robot assembly 103 is beneficial to system 100 because it allows the transfer of substrates between a FOUP disposed on one of load stations 104 A-C and staging platforms 123A, 123B despite the difference in substrate density generally present between a standard FOUP and staging platforms 123A, 123B. Multiple blade transfer of substrates therebetween necessitates a variable pitch robot blade, i.e., a multiple blade robot arm with the capability to vary the distance, or pitch, between substrates. Variable pitch robot blades, while known in the art, are relatively complex, which may impact overall system downtime and therefore COO.

Figure 1H:
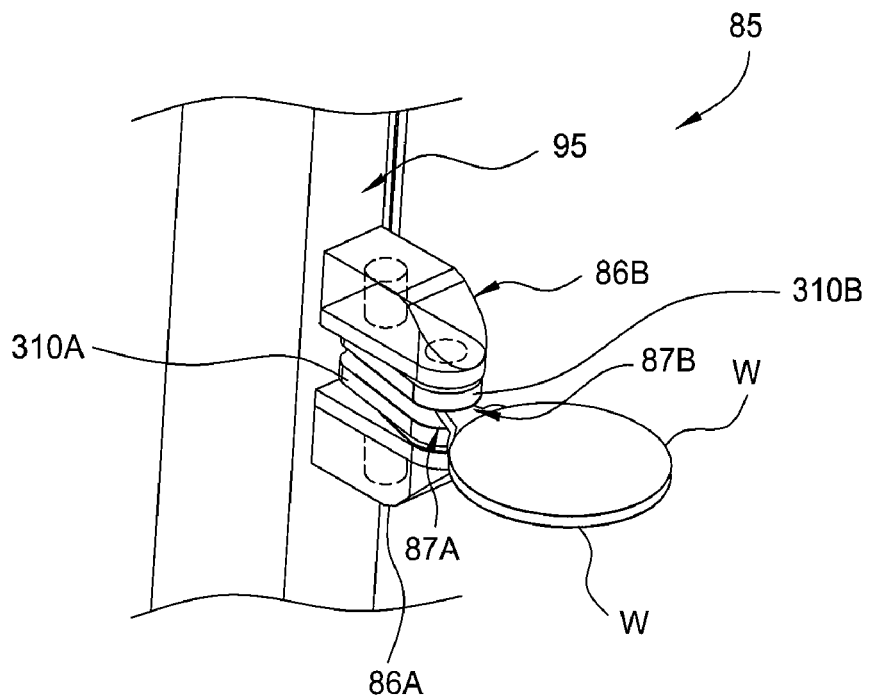
FIG. 1H illustrates one configuration of a robot hardware assembly that contains two transfer robots that are positioned in an opposing orientation to each other.
Figure 1I:
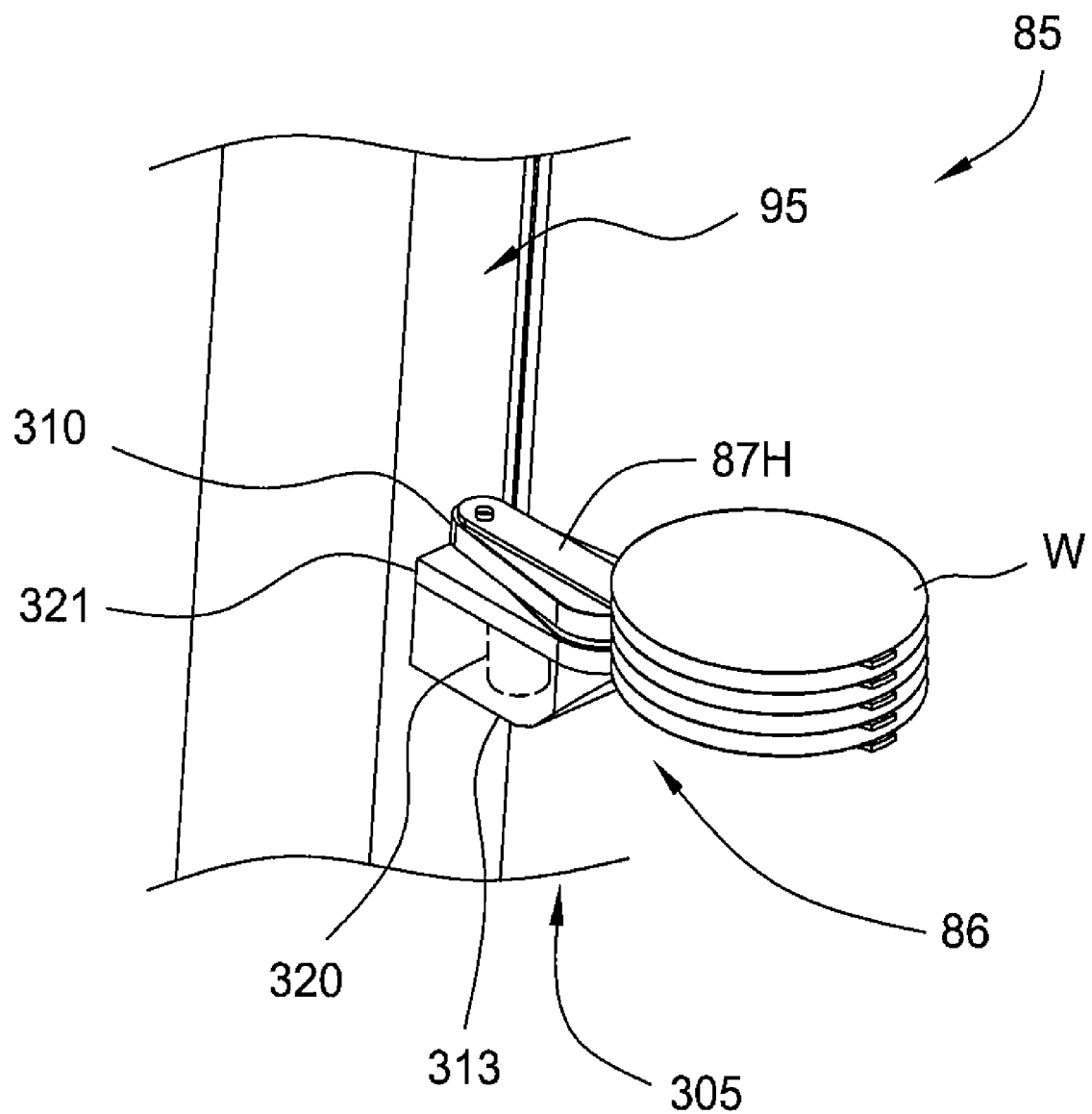
FIG. 1I illustrates a five blade robot arm.

FIG. 1H illustrates one configuration of robot hardware assembly 85 that contains two transfer robots 86A, 86B that are positioned in an opposing orientation to each other, i.e., vertically mirrored, so that the blades 87A-B (and first linkages 310A-310B) can be placed a small distance apart. The configuration shown in FIG. 1H, i.e., an "over/under" type blade configuration, may be advantageous, for example, where it is desired to "swap" substrates, i.e., to remove a substrate from a location and immediately replace it with another substrate with minimal robot motions. For example, it is desirable to remove a processed substrate from processing cassette 146 with transfer robot 86A and immediately replace it with an unprocessed substrate that has already been taken from staging cassette 186 and is available on second transfer robot 86B. Because there is no need to transfer the processed substrate to another location before loading the unprocessed substrate, this substrate swap can take place without necessitating robot hardware assembly 85 or robot assembly 11 leaving their basic positions, substantially improving system throughput. This is particularly the case for system 100 during transfer of substrates between staging platforms 123A, 123B and buffer chambers 122A, 122B, respectively. The over/under blade configuration illustrated in FIG. 1H allows unprocessed substrates disposed on staging platforms 123A, 123B to be swapped with processed substrates disposed in buffer chambers 122A, 122B respectively. Hence, no additional staging/cooling location for substrates is required to enable this substrate swap when the over/under blade configuration, or variations thereof, is used. This significantly reduces the footprint of system 100 while minimizing the time reactors 121A, 121B are idle while processing cassette 146 is being emptied and refilled with substrates.

In another configuration, robot hardware assembly 85 may further include at least one multiple blade, fixed-pitch robot arm, enabling swapping of multiple substrates between staging platforms 123A, 123B and buffer chambers 122A, 122B as described above. In one example, transfer robot 86A includes a five blade robot arm 87H, as illustrated in FIG. 1I. In another example, transfer robot 86A and second transfer robot 86B both include a multiple blade robot arm, enabling swapping of multiple substrates between staging platforms 123A, 123B and buffer chambers 122A, 122B, respectively, as described above in conjunction with FIG. 1H.

Figure 1J:
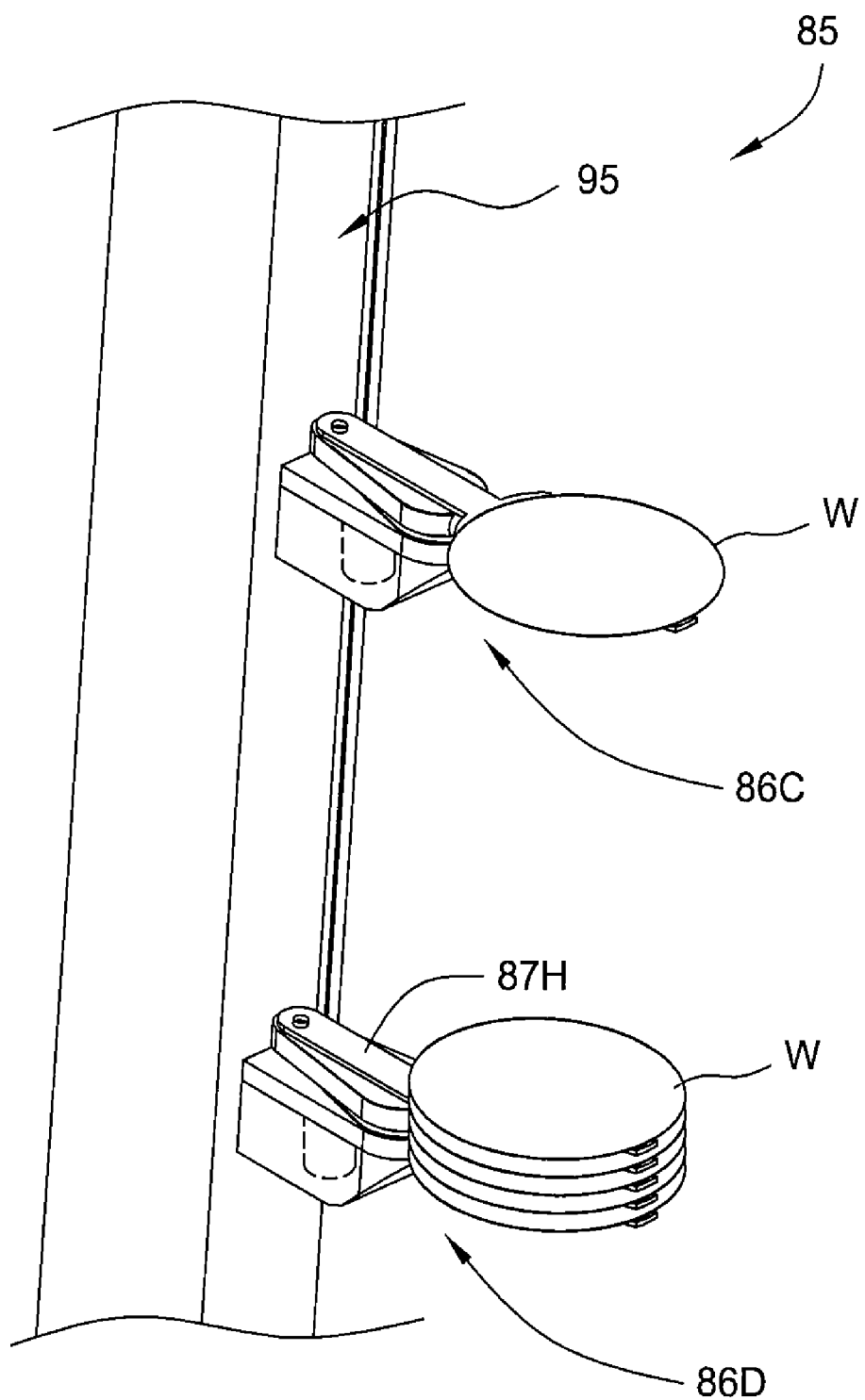
FIG. 1J illustrates a preferred configuration of robot hardware assembly that includes a single blade transfer robot and a multiple blade transfer robot.

FIG. 1J illustrates a preferred configuration of robot hardware assembly 85 of robot assembly 11, which includes a single blade transfer robot 86C and a multiple blade transfer robot 86D. Single blade transfer robot 86C may transfer substrates W between load stations 104A-C and staging cassette 186. Multiple blade transfer robot 86D may transfer substrates W between staging cassette 186 and processing cassette 146.

It is important to note that the configuration of system 100, as illustrated in FIG. 1A, allows the transfer of substrates between staging platforms 123A, 123B and buffer chambers 122A, 122B, respectively, without the need for horizontal translation of vertical robot assembly 95 by horizontal robot assembly 90, which substantially reduces transfer times. This configuration significantly increases system throughput by minimizing processing chamber idle time. Because reactors 121A, 121B are idle whenever their respective processing cassette 146 is being unloaded, the substrate transfer should be carried out as quickly as possible. Eliminating the need for horizontal translation of vertical robot assembly 95 during substrate transfer accomplishes this goal.

An additional advantage of the use of a cartesian robot, as illustrated in FIGS. 1F-1J, is that a smaller system footprint is required for substrate transfers to be carried out within transfer region 135 compared to conventional substrate transfer robots, such as a selective compliance assembly robot arm (SCARA). This is illustrated by FIGS. 1K and 1L. The width $W_1$, $W_2$ of a clearance region 90A that surrounds a transfer robot assembly 103 is minimized. Clearance region 90A is defined as a region adjacent a substrate transferring robot, such as transfer robot assembly 103, wherein the substrate transferring robot's components and a substrate S are free to move without colliding with other cluster tool components external to the substrate transferring robot. While the clearance region 90A may be described as a volume, often the most important aspect of the clearance region 90A is the horizontal area (x and y-directions), or footprint, occupied by the clearance region 90A, which directly affects a cluster tool's footprint and COO. The footprint of clearance region 90A is illustrated in FIGS. 1K, 1L as the regions defined by the length L and width $W_1$, $W_2$, respectively. In addition to smaller system footprint, a smaller clearance region allows closer positioning between transfer robot assembly 103 and locations that are accessed thereby, such as buffer chambers 122A, 122B and staging platforms 123A, 123B, reducing substrate transfer times and increasing throughput. The configurations of transfer robot assembly 103 described herein have particular advantage over a SCARA robot CR illustrated in FIG. 1L. This is due to the way in which the transfer robot 86, as illustrated in FIG. 1K, may retract its components to be oriented along the major length L of clearance region 90A. A SCARA robot CR, as illustrated in FIG. 1L, cannot.

Figure 1M:
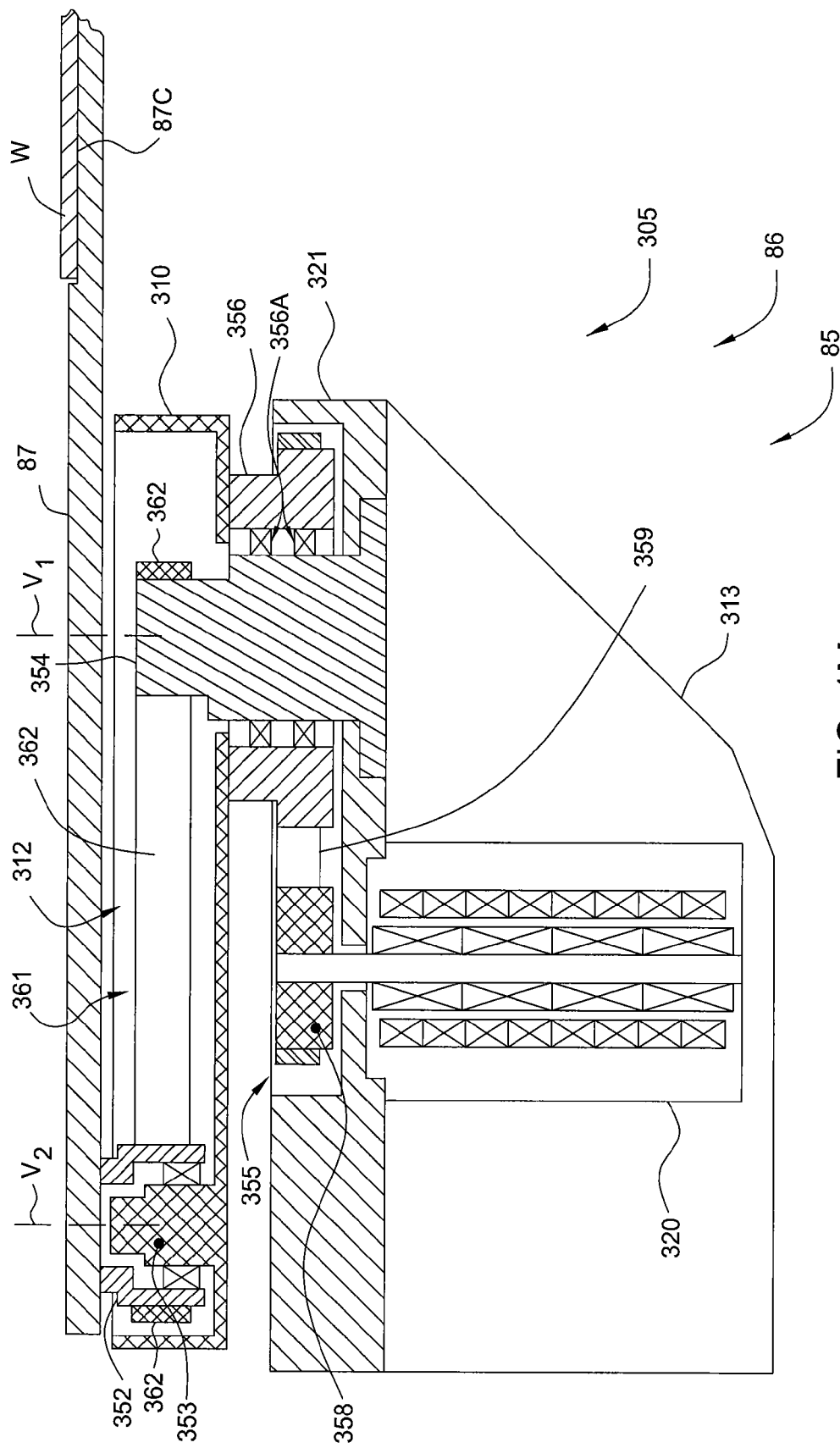
FIG. 1M illustrates a cross-sectional side view of one configuration of a two bar linkage robot.

FIGS. 1G, 1H, 1I and 1M illustrate one configuration of a two bar linkage robot 305 that, when used as transfer robot 86, may retract as shown in FIG. 1K. Referring to FIG. 1M, Two bar linkage robot 305 generally contains a support plate 321, a first linkage 310, a robot blade 87, a transmission system 312, an enclosure 313 and a motor 320. In this configuration the two bar linkage robot 305, which is serving as transfer robot 86, is attached to the vertical motion assembly 95 through the support plate 321 which is attached to the vertical motion assembly 95 (shown in FIG. 1F). FIG. 1M illustrates a cross-sectional side view of one configuration of the two bar linkage robot 305 type of transfer robot assembly 86. The transmission system 312 in the two bar linkage robot 305 generally contains one or more power transmitting elements that are adapted to cause the movement of the robot blade 87 by motion of the power transmitting elements, such as by the rotation of motor 320. In general, the transmission system 312 may contain gears, pulleys, etc. that are adapted to transfer rotational or translation motion from one element to another. In one aspect the transmission system 312, as shown in FIG. 1M, contains a first pulley system 355 and a second pulley system 361. The first pulley system 355 has a first pulley 358 that is attached to the motor 320, a second pulley 356 attached to the first linkage 310, and a belt 359 that connects the first pulley 358 to the second pulley 356, so that the motor 320 can drive the first linkage 310. In one aspect, a plurality of bearings 356A are adapted to allow the second pulley 356 to rotate about the axis $V_1$ of the third pulley 354.

The second pulley system 361 has a third pulley 354 that is attached to support plate 321, a fourth pulley 352 that is attached to the blade 87 and a belt 362 that connects the third pulley 354 to the fourth pulley 352 so that the rotation of the first linkage 310 causes the blade 87 to rotate about the bearing axis 353 (pivot $V_2$) coupled to the first linkage 310. When in transferring a substrate the motor drives the first pulley 358 which causes the second pulley 356 and first linkage 310 to rotate, which causes the fourth pulley 352 to rotate due to the angular rotation of the first linkage 310 and belt 362 about the stationary third pulley 354. In one embodiment, the motor 320 and system controller 111 are adapted to form a closed-loop control system that allows the angular position of the motor 320 and all the components attached thereto to be controlled. In one aspect the motor 320 is a stepper motor or DC servomotor.

A more detailed description of a Cartesian robot that may be contained in some configurations of the invention may be found in commonly assigned U.S. patent application Ser. No. 11/398,218 filed on Apr. 5, 2006, which is hereby incorporated by reference in its entirety to the extent not inconsistent with the claimed invention.

Process Fluid Delivery System

For ALD and CVD processing of substrates, there are generally three methods that chemical precursors are treated to form a process fluid that can be delivered to a process volume of a processing chamber to deposit a layer of a desired material on a substrate. The term process fluid, as used herein, is generally meant to include a gas, vapor, or a liquid. The first treatment method is a sublimation process in which the precursor, which is in solid form in an ampoule, is vaporized using a controlled process, allowing the precursor to change state from a solid to a gas or vapor in the ampoule. The precursor-containing gas or vapor is then delivered to the process volume of a processing chamber. The second method used to generate a precursor-containing process gas is by an evaporation process, in which a carrier gas is bubbled through a temperature controlled liquid precursor, and thus is carried away with the flowing carrier gas. A third process used to generate a precursor is a liquid delivery system in which a liquid precursor is delivered to a vaporizer by use of a pump, in which the liquid precursor changes state from a liquid to a gas by the addition of energy transferred from the vaporizer. The added energy is typically in the form of heat added to the liquid. In any of the three methods described above for creating a precursor-containing process fluid, it is typically necessary to control the temperature of the precursor ampoule as well as the fluid delivery lines between the ampoule and the processing chamber. This is particularly true of ALD processes, wherein temperature control of said delivery lines is very important in achieving process repeatability. Hence, when tight control of precursor temperature is required, the distance between the precursor ampoule and the processing chamber served thereby should be minimized to avoid unnecessary system cost, complexity, and reliability.

Figure 1N:
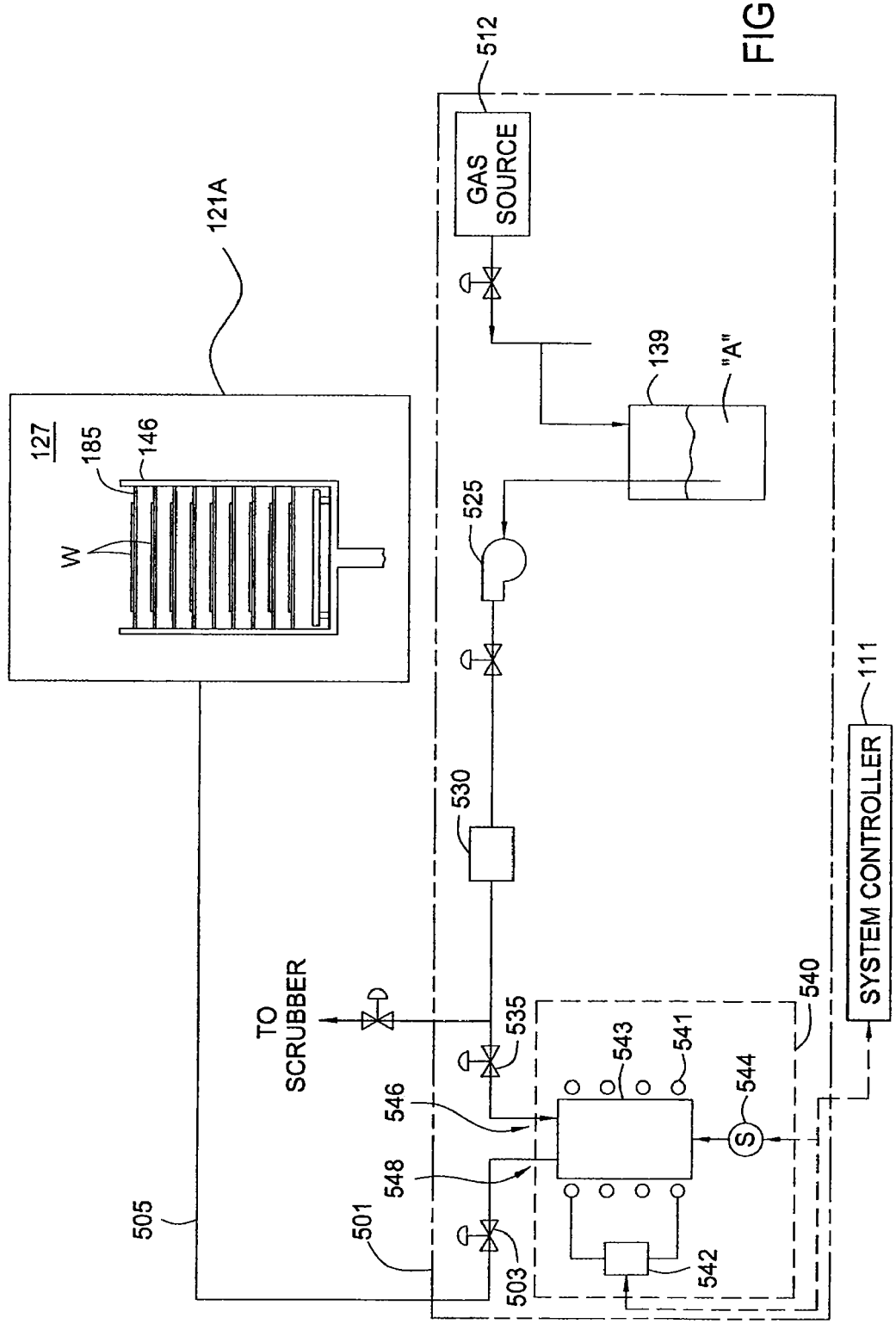
FIG. 1N illustrates a schematic diagram of one configuration of a precursor delivery system.
Figure 10:
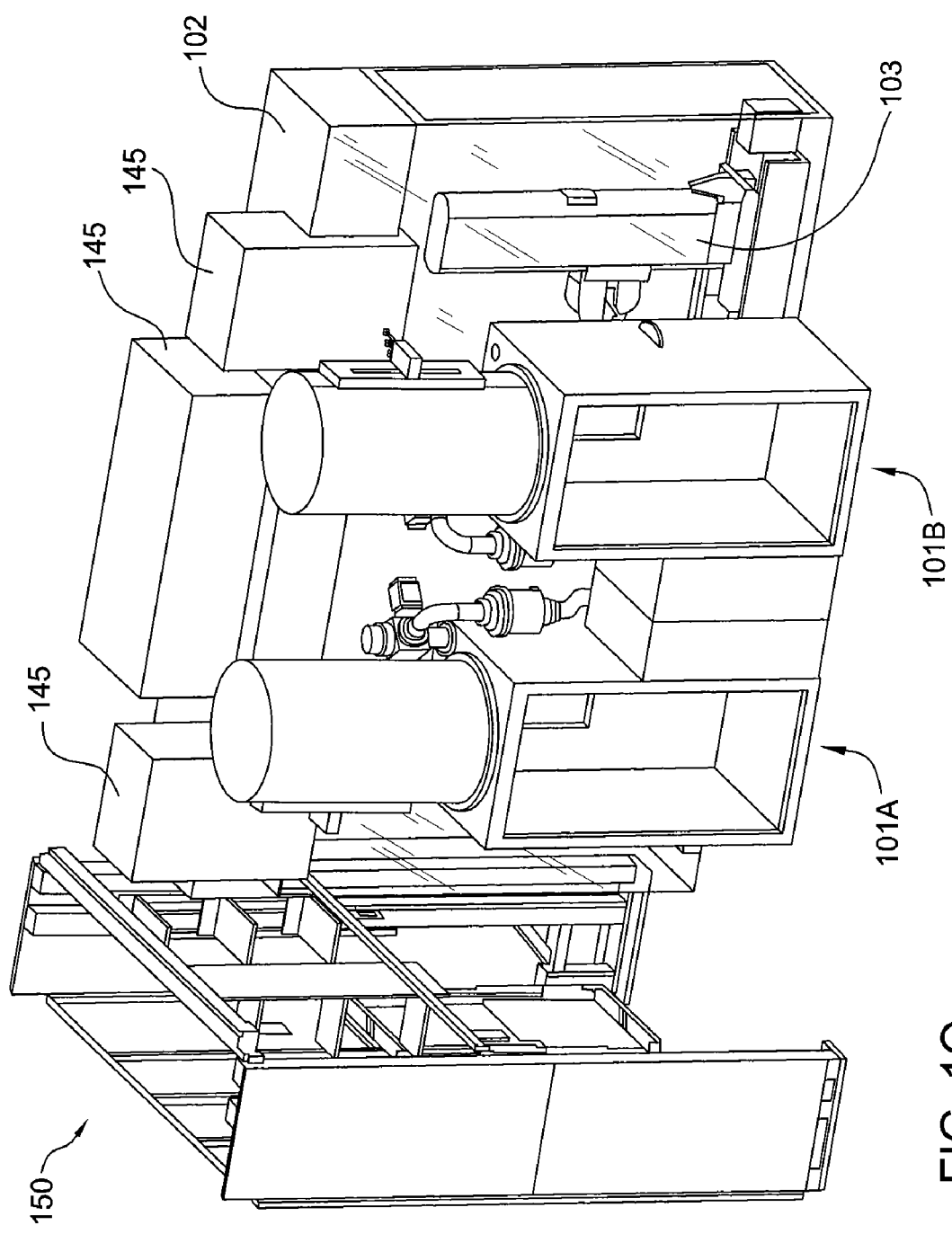

FIG. 1N illustrates a schematic diagram of one configuration of a precursor delivery system 501 that is used to deliver a process fluid to the process volume of a processing chamber, such as reactor 121A. In the example illustrated, precursor delivery system 501 is a liquid delivery type process fluid source. The components of precursor delivery system 501 may be contained proximate each other in a facilities tower 130, which is illustrated in FIG. 1A. Precursor delivery system 501 is fluidly coupled to reactor 121A via inlet line 505, which may be contained in an overhead rack 140. The routing of inlet line 505 to reactor 121A through overhead rack 140 enables positioning of precursor delivery system 501 proximate reactors 121A without impeding service access to batch processing stations 101A, 101B. Ordinarily, precursor delivery system 501 is located significantly further from reactor 121A, for example in a different room or even a different floor. Referring back to FIG. 1N, precursor delivery system 501, in this configuration, generally includes the following components: an ampoule gas source 512, an ampoule 139 containing a precursor "A", a metering pump 525, a vaporizer 530, an isolation valve 535, a collection vessel assembly 540 and a final valve 503. The collection vessel assembly 540 generally includes the following components: an inlet 546, an outlet 548, a vessel 543, a resistive heating element 541 surrounding the vessel 543, a heater controller 542 and a sensor 544. In one configuration, the heater controller 542 is part of the system controller 111.

Precursor delivery system 501 is adapted to deliver a process gas to the process volume 127 of reactor 121A from the ampoule 139 containing a liquid precursor. To form a gas from a liquid precursor, the liquid precursor is vaporized by use of a metering pump 525 which pumps the precursor into the vaporizer 530, which adds energy to the liquid, causing it to change state from a liquid to a gas. Metering pump 525 is adapted to control and deliver the liquid precursor at a desired flow rate set point throughout the process recipe step, by use of commands from the system controller 111. The vaporized precursor is then delivered to the collection vessel assembly 540 where it is stored until it is injected into the process volume 127 and across the surface of the substrates W.

The inlet line 505 is heated to assure that an injected precursor does not condense and remain on the surface of inlet line 505, which can generate particles and affect the chamber process. It is also common to control the temperature of the inlet line 505 and other components of precursor delivery system 501 below the precursor decomposition temperature to prevent gas phase decomposition and/or surface decomposition of the precursor thereon. Hence, reliable temperature control of numerous components of precursor delivery system 501, including inlet line 505, is important to CVD and particularly ALD processes. The temperature control should reliably maintain the necessary components of precursor delivery system 501 within a well-defined temperature window to avoid serious process problems.

Because reliable and accurate temperature control of inlet line 505 are made much more problematic and expensive for a longer inlet line 505, inlet line 505 may be minimized by positioning precursor delivery system 501 as close as possible to the reactors serviced thereby. Referring to FIG. 1A, precursor delivery system 501 may be located in facilities tower 130, which is proximate reactors 121A, 121B. To that end, facilities tower 130 is positioned as close as possible to reactors 121A, 121B while still maintaining a service distance 137 that is adequate to accommodate service of facilities tower 130 and other components of system 100, such as batch processing station 101B and transfer robot assembly 103 via access door 135A. Service distance 137 may be a SEMI (Semiconductor Equipment and Materials International) compliant service distance, usually on the order of 36 inches. Alternatively, precursor delivery system 501 may be positioned in cabinets 146A, 146B proximate batch processing stations 101A, 101B, respectively, as shown in FIG. 1B. In another configuration, precursor delivery system 501 may be positioned on top of system 100 in cabinets 145, as illustrated in FIG. 1O.

FOUP Stocker

Unlike single-substrate processing systems, a batch processing system, such as system 100, typically processes substrates from multiple FOUP's simultaneously. For example, a standard FOUP contains up to 25 substrates whereas a batch of substrates processed by system 100 may be as large as 50 or 100 substrates. Considering that system 100 may include two or more batch processing stations, as many as 100 to 200 substrates may be undergoing processing at any one time in system 100, the equivalent of up to 12 or more FOUP's. In order to minimize the footprint of system 100, however, FI 102 typically only includes two or three load stations 104A-C, as illustrated in FIG. 1A. Empty FOUP's waiting for processed substrates must therefore be removed from the load stations 104A-C to allow loading and unloading of substrates from other FOUP's. In addition, each FOUP must be correctly staged to load stations 104A-C after processing so that the correct substrates are loaded therein. Further, FOUP's must be received from and returned to the central FOUP transport system of the fabrication plant, such as an overhead monorail FOUP transport system. Hence, managing a large number of FOUP's during processing without slowing throughput or unreasonably expanding the footprint of system 100 is a non-trivial consideration.

To that end, system 100 may be configured with a FOUP stocker 150 (shown in FIG. 1B) positioned proximate load stations 104A-C. The FOUP stocker may include one or more storage shelves and FOUP transfer mechanisms that may include a shelf capable of raising or lowering a FOUP between the FOUP storage locations and load stations 104A-C of system 100. In one configuration, the storage shelves are themselves adapted to raise and lower a FOUP therebetween. In another configuration, a FOUP handler or other FOUP transfer device may be adapted to transfer a FOUP between the FOUP storage locations and load stations 104A-C. The FOUP stocker may be positioned in front of or beside the fabrication tool, but to avoid increasing the footprint of system 100, the FOUP stocker is preferably positioned over load stations 104A-C.

Figure 1P:
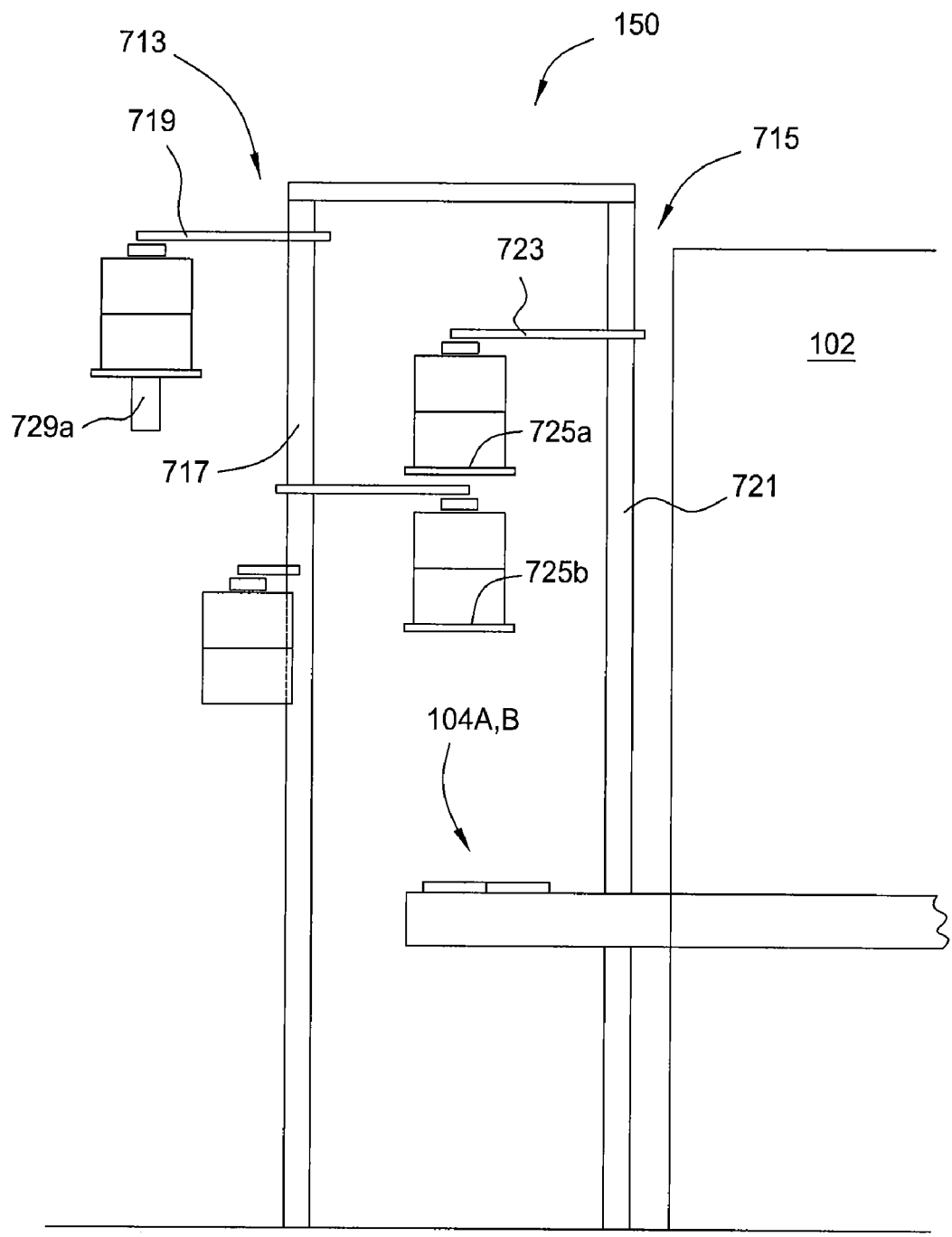
FIG. 1P is a side view of an exemplary stocker apparatus.

FIG. 1P is a side view of a stocker apparatus, stocker 150, adapted for the management of sealed substrate transport pods, such as FOUP's, during the processing by a batch processing platform, such as system 100. The stocker 150 includes first and second vertical transfer mechanisms, i.e., a first robot 713 and a second robot 715, respectively. The first robot 713 includes a first y-axis component 717 and a first x-axis component 719 movably coupled to the first y-axis component 717 such that the first x-axis component 719 may travel along the length of the first y-axis component 717. Similarly, the second robot 715 includes a second y-axis component 721 and a second x-axis component 723 movably coupled to the second y-axis component 721 such that the second x-axis component 723 may travel along the length of the second y-axis component 721. Operatively coupled between the first robot 713 and the second robot 715 are one or more storage locations 725a, 725b.

The first robot 713 is configured such that when the first x-axis component 719 is at the lower portion of the first y-axis component 717 it may access the one or more load stations 104A-B and position a FOUP thereon. The first robot 713 is further configured such that when the first x-axis component 719 is at the upper portion of the first y-axis component 717 it may access an overhead wafer carrier transport system such as a monorail, referenced generally by the numeral 729a. The second robot 715 is configured such that when the second x-axis component 723 is at the lower portion of the second y-axis component 721 it may also access the one or more load stations 104A-B and position a FOUP thereon. Both the first x-axis component 719 and the second x-axis component 23 are configured so as to reach any of the storage locations 725a, 725b. In a preferred configuration, first robot 713 is adapted with a plurality of first y-axis components 717 in lieu of storage locations 725a, 725b. In this preferred configuration, second robot 715 is similarly configured.

Figure 1Q:
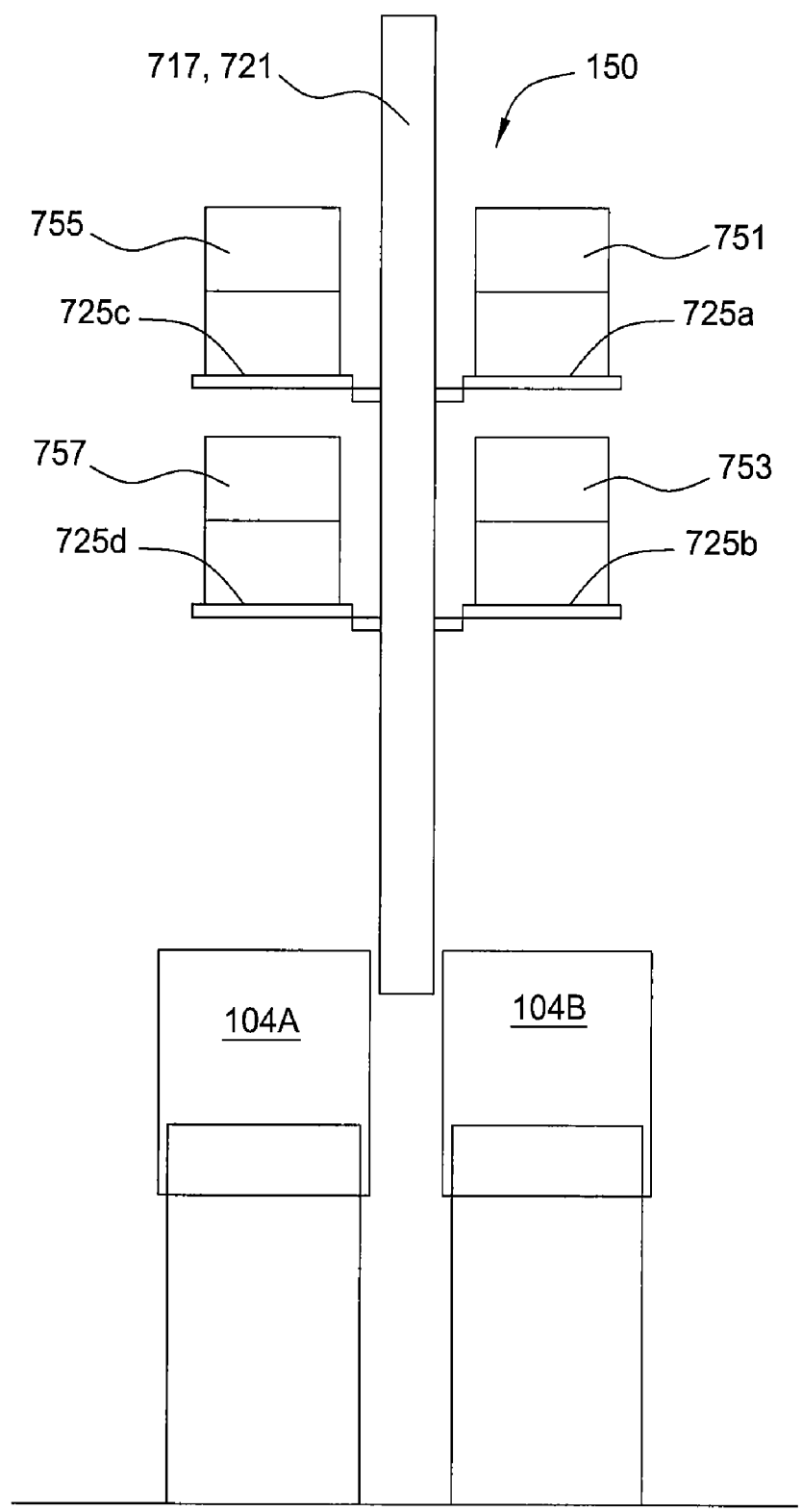
FIG. 1Q is a front elevation view of the stocker apparatus of FIG. 1P.

FIG. 1Q is a front elevation view of the stocker 150 of FIG. 1P which shows a preferred arrangement of four storage locations 725a, 725b, 725c, and 725d, above load stations 104A, 104B. FOUP's 751, 753, 755, and 757 are in storage on the storage locations 725a, 725b, 725c and 725d, respectively. The FOUP capacity of the stocker 150 may be increased with additional storage locations added above and/or adjacent storage locations 725a, 725b, 725c and 725d. Additional storage locations positioned adjacent storage locations 725a, 725b, 725c and 725d may require one or more additional robots similar to first robot 713 and second robot 715, each configured with an x-axis component and a y-axis component.

Multiple Arm Robot Platform—Zero Side Access Configuration

In one aspect of the invention, the multiple arm robot platform includes two batch processing chambers configured with a service aisle disposed therebetween to provide necessary service access to the transfer robot and the deposition stations. Required service areas are generally included as part of the footprint in the COO calculation for a substrate processing system, often making up a substantial fraction of the overall footprint of the system. Further, if required access areas are not only reduced but are eliminated on both sides of a processing system, one processing system may be situated abutting other systems, maximizing efficient use of floor space. Therefore, incorporation of all required service areas into other regions of a substrate processing system in a manner that eliminates the need for side access can substantially reduce the effective footprint thereof.

Figure 2A:
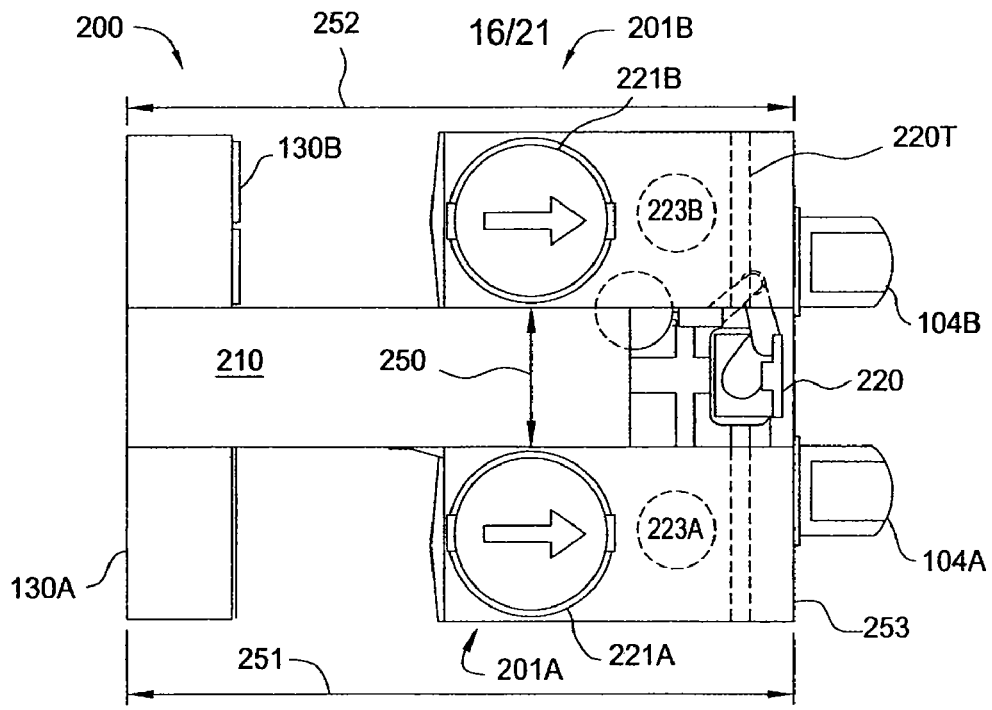
FIG. 2A is a schematic plan view of a batch processing platform.
Figure 2B:
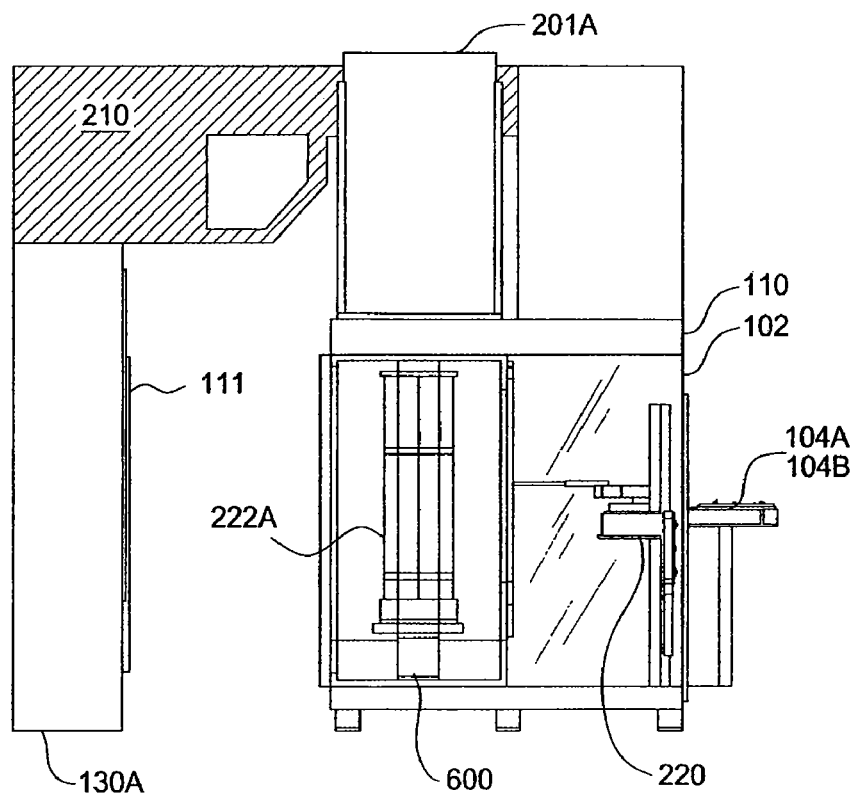
FIG. 2B is a schematic side view of a batch processing platform.
Figure 2C:
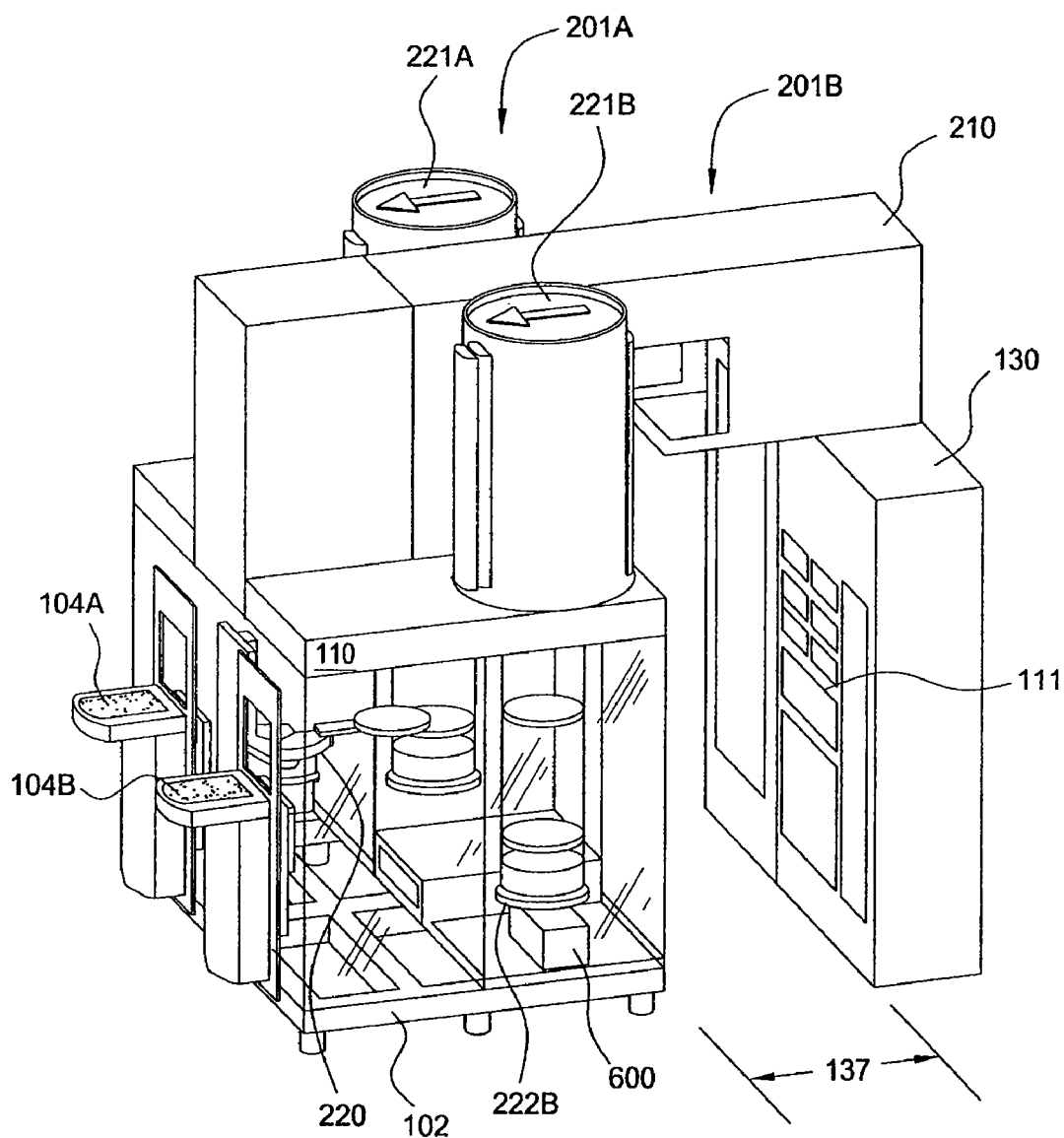
FIG. 2C is a perspective view of a batch processing system.

FIG. 2A is a schematic plan view of one aspect of the invention, a batch processing platform, hereinafter referred to as system 200, wherein no side access is required in order to service all components thereof. FIG. 2B is a schematic side view of system 200. FIG. 2C is a perspective view thereof.

System 200 generally includes two or more batch processing stations 201A, 201B, a system controller 111, a factory interface (FI) 102, containing a transfer robot 220 and one or more load stations 104A, 104B, and a process fluid delivery system. The fluid delivery system may be contained in facilities towers 130A, 130B and is organized substantially the same as the process fluid delivery system for system 100, described above in conjunction with FIG. 1N. As with system 100, a FOUP stocker (not shown) may be positioned over load stations 104A, 104B to provide local storage of FOUP's or other substrate transport pods during batch processing of substrates.

The batch processing stations 201A, 201B are disposed adjacent FI 102 and are separated from each other by a common access space 250, which is adapted to provide service access to batch processing stations 201A, 201B and to transfer robot 220. The presence of common access space 250 obviates the need for side access areas along sides 251, 252 of system 200, allowing system 200 to be positioned directly in contact with a wall or other processing system along sides 251, 252.

Referring to FIGS. 2A-D, batch processing station 201A includes a reactor 221A, a buffer chamber 222A positioned adjacent reactor 221A, and a staging platform 223A positioned in FI 102 and adapted to support a staging cassette (not shown) proximate reactor 221A. Similarly, batch processing station 201B includes a reactor 221B, a buffer chamber 222B, and a staging platform 223B positioned in FI 102 and adapted to support a staging cassette (not shown) proximate reactor 221B. Batch processing stations 201A, 201B and FI 102 and overhead rack 210 are generally organized the same as their counterparts in system 100, batch processing stations 101A, 101B described above in conjunction with FIG. 1A.

One difference between the organization and operation of system 200 from system 100 is the relative orientation of FI 102, batch processing stations 201A, 201B, and the transfer robot. In system 200, there is preferably one load station positioned opposite each batch processing station. In the configuration illustrated in FIG. 2A for example, load stations 104A, 104B are positioned opposite batch processing stations 201A, 201B, respectively. Another difference between system 100 and system 200 is the configuration of the transfer robot. In system 200, transfer robot 220 is preferably not a Cartesian robot, unlike transfer robot assembly 103. Transfer robot 220 may be a conventional SCARA robot mounted on a track 220T. Transfer robot 220 is adapted to travel along track 220T to serve all batch processing stations 201A, 201B of system 200. Because less service access is required for this configuration of robot, it may be serviced adequately from common access space 250 or from front skin 253.

Other features of transfer robot 220 are substantially the same as transfer robot assembly 103, including the use of a single blade robot arm for transferring substrates from the a low density FOUP to a higher density staging cassette and the use of a multiple blade robot arm for transferring multiple substrates from a staging FOUP to an equal density processing cassette.

In one configuration, a stationary transfer robot, i.e., not track-mounted, is disposed between each batch processing station 201A, 201B and load station 104A, 104B, respectively. In this configuration, each transfer robot serves a single batch processing station. If batch processing stations 201A, 201B are each adapted to perform a different process on groups of substrates sequentially, stocker 150 enables the transfer of substrates between batch processing stations 201A, 201B by moving FOUP's between load stations 104A, 104B as required.

Figure 2D:
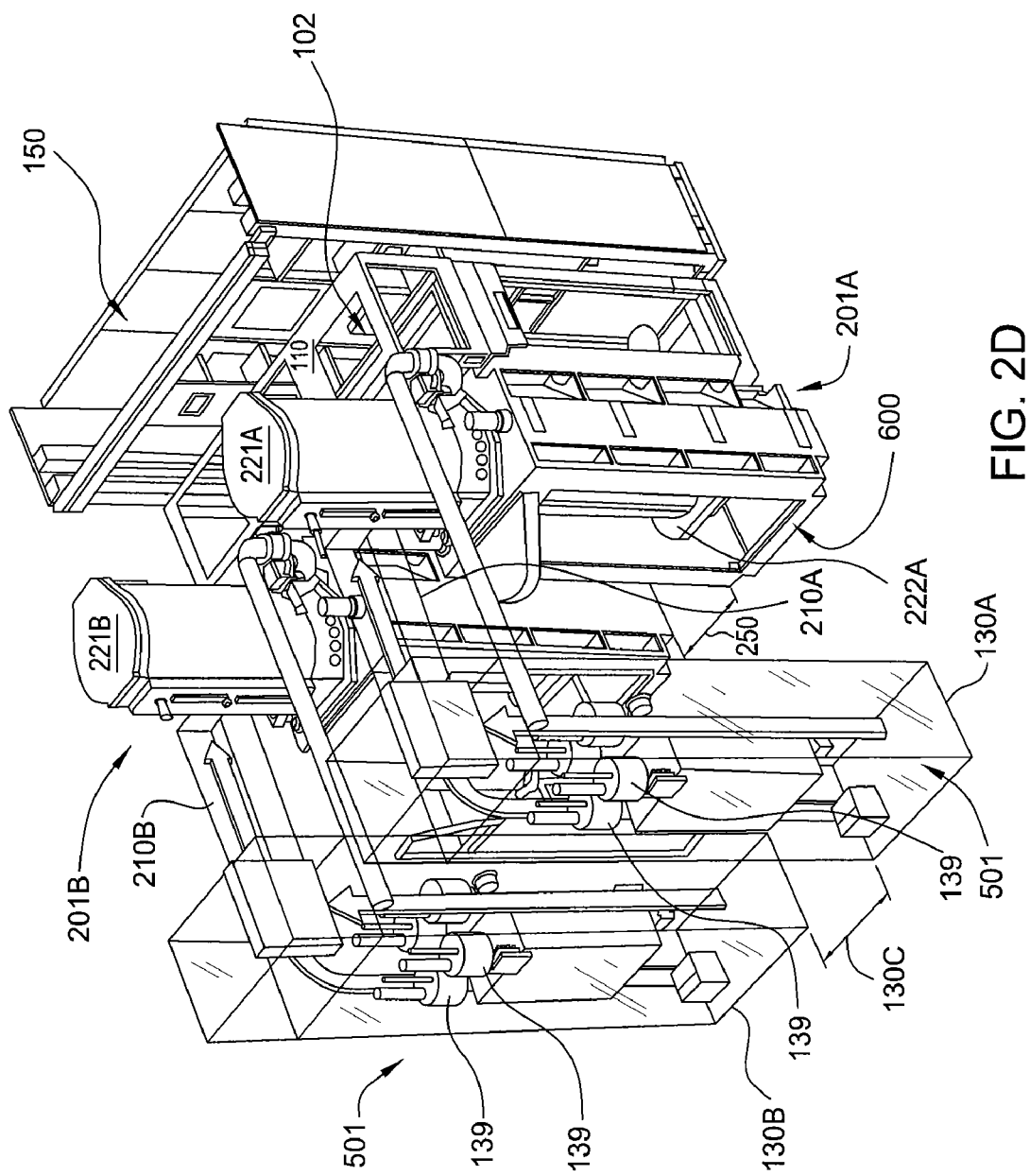
FIG. 2D is a perspective view of a batch processing system.

System 200 may include a dedicated facilities tower 130A, 130B for each batch processing station 201A, 201B, as illustrated in FIGS. 2A and 2D, each containing a precursor delivery system 501. In this configuration, the use of facilities towers 130A, 130B creates an access opening 130C between facilities towers 130A and 130B. In another configuration, facilities towers 130A, 130B may be combined into a single facilities tower containing a precursor delivery system 501 for each batch processing station 201A, 201B.

Cassette Handler Platform

In another embodiment of the invention, a cassette handler transfers the processing cassette between a processing chamber and a cooling station to minimize chamber idle time. A single arm robot transfers individual substrates between a substrate transport pod and a processing cassette. In one aspect, the cassette handler is a linear translator adapted to transfer a processing cassette between one or more processing chambers and a cooling station. In another aspect, the cassette handler is a rotary table adapted to swap a cassette of unprocessed substrates with a cassette of processed substrates.

Linear Translator Configuration

FIG. 3A is a schematic plan view of one aspect of the invention, a batch processing platform containing a linear translator, hereinafter referred to as system 300. The linear translator robot is adapted to transfer processing cassettes between a staging platform, at least one batch processing chamber, and a cassette loading station. FIG. 3B is a schematic side view of system 300.

To maintain high throughput for a batch processing platform, it is important to minimize reactor idle time. Contributing factors to reactor idle time include long pump-down and vent times for the reactor, substrate cooling time, and substrate transfer time. The configuration illustrated in FIGS. 3A, 3B may reduce or eliminate the contribution of each of these factors on system throughput.

System 300 includes one or more reactors 1301, 1302, a cassette transfer region 1305, a factory interface (FI) 102, and a process fluid delivery system. FI 102 contains one or more load stations 104A-C, a cassette loading station 1303, an environmental control assembly 110, and a loading robot 1304 adapted to transfer substrates between the load stations 104A-C and a processing cassette positioned on cassette loading station 1303. Cassette transfer region 1305 contains a staging platform 1306 and a linear translator robot 1320, which is mounted to a horizontal rail 1321 and is adapted to transfer processing cassettes between the staging platform 1306, the reactors 1301, 1302, and the cassette loading station 1303. The process fluid delivery system may be contained in facilities towers 130A, 130B and is organized substantially the same as the process fluid delivery system for system 100, described above in conjunction with FIG. 1N. As with system 100, a FOUP stocker may be positioned over load stations 104A-C to provide local storage of FOUP's or other substrate transport pods during batch processing of substrates.

Components of system 300 that are substantially the same in organization and operation as the corresponding components of system 200 include FI 102, transfer robot 1304, reactors 1301, 1302, facilities towers 130A, 130B, and the process fluid delivery system.

In operation, a first processing cassette 1330 disposed in FI 102 and positioned on cassette loading station 1303 is loaded with substrates from one or more FOUP's positioned on load stations 104A-C by transfer robot 1304. In one configuration, transfer robot 1304 may be a single track-mounted robot similar to transfer robot 220, described above in conjunction with FIGS. 2A-C. First processing cassette 1330 is then vertically translated to a position adjacent load lock 1309 by a vertical lift mechanism 1303A, such as a vertical indexer or a motorized lift. Processing cassette 1330 is then loaded into load lock 1309 and is pumped down to a level of vacuum substantially equal to that present in cassette transfer region 1305 and reactors 1301, 1302. Processing cassette 1330 may also be pressure cycled prior to entry into cassette transfer region 1305. After pump-down, vacuum-tight door 1312 opens and processing cassette 1330 is transferred from load lock 309 into cassette transfer region 1305 by linear translator robot 1320, which is adapted with a cassette lift mechanism. Linear translator robot 1320 is adapted to translate a processing cassette along horizontal path 1322, to transfer a processing cassette vertically into and out of the one or more reactors 1301, 1302 along vertical paths 1323, and to transfer a processing cassette on or off of staging platform 1306. First processing cassette 1330 is then loaded into an idle reactor, such as reactor 1301 or 1302 by linear translator robot 1320. After processing is complete, first processing cassette 1330 is unloaded from reactor 1301 by linear translator robot 1320 and transferred to staging cassette 1306 for cooling. After the substrates are sufficiently cooled, first processing cassette 1330 is transferred to load lock 1309 by linear translator robot 1320, vented to atmospheric pressure, lowered into FI 102 by vertical lift mechanism 1303A, and unloaded by transfer robot 1304. Alternatively, first processing cassette may undergo atmospheric cooling in load lock 1309 after being vented to atmosphere. In this configuration, free or forced convective cooling may be used.

In a preferred sequence, first processing cassette 1330 is positioned in load lock 1309 with unprocessed substrates before processing is completed on second processing cassette 1331 in reactor 1301. In so doing, reactor 1301 is idle for a short time, i.e., on the order of about 1 minute. Reactor idle time is no longer than the time necessary for linear translator robot 1320 to transfer second processing cassette 1331 to staging platform 1306 plus the time to transfer first processing cassette 1330 into reactor 1301. Substrate loading and unloading as well as load lock pumping and venting are carried out "off-line", i.e., while the reactors are processing substrates. Hence, the reactors are not idle while the time-consuming steps involved in transferring substrates from load stations 104A-C to reactors 1301, 1302 take place, maximizing system throughput. Preferably, reactors 1301, 1302 are staged, i.e., substrate processing is started alternately in each, to ensure that reactor loading/unloading is not limited by the availability of linear translator robot 1320.

In an alternate configuration, cassette transfer region 1305 is an atmospheric pressure transfer region, preferably purged with low moisture, inert gas, such as dry nitrogen. In this configuration, a processing cassette is loaded with substrates in FI 102 and transferred directly to reactors 1301, 1302 without passing through a vacuum load lock. In this configuration, vertical lift mechanism 1303A and load lock 1309 are not needed.

In another alternate configuration, each of reactors 1301, 1302 of system 300 may be adapted to sequentially perform a different batch process on the same group of substrates. In this configuration, the preferred processing sequence includes processing first processing cassette 1330 in reactor 1301 with the first batch process, transferring first processing cassette 1330 to reactor 1302 with linear translator robot 1320 for processing with a second batch process. First processing cassette 1330 is then transferred to staging platform 1306 for cooling and subsequent removal from systems 300 as described above.

Rotational Cross Configuration

FIG. 4A is a schematic plan view of one aspect of the invention, a batch processing platform, hereinafter referred to as system 400, wherein a rotational cross robot is adapted to rotatably swap two pairs of processing cassettes between two reactors and two vacuum load locks. FIG. 4B is a schematic side view of system 400.

As noted above, system throughput is substantially improved by performing the most time-consuming elements of substrate transfer while the reactors are processing substrates, such as substrate loading and unloading and load lock pumping and venting. The configuration illustrated in FIGS. 4A and 4B may reduce or eliminate the contribution of these factors on system throughput.

System 400 includes two reactors 401, 402, two vacuum load locks 403, 404, an evacuated cassette transfer region 406 positioned beneath the vacuum load locks 403, 404 and the reactors 401, 402, a factory interface (FI) 102, and a process fluid delivery system. Load locks 403, 404 may serve as cool-down stations for cassettes containing processed substrates and may further serve as loading stations for transferring substrates between processing cassettes disposed therein and load stations 104A-C. FI 102 contains one or more load stations 104A-C, an environmental control assembly 110, and a transfer robot 405 adapted to transfer substrates between the load stations 104A-C and the vacuum load locks 403, 404. Transfer robot 405 is substantially the same single track-mounted robot as transfer robot 220, described above in conjunction with FIGS. 2A-D, but with an extended z-motion capability. System 400 also includes a rotational cross robot 407 is positioned in evacuated cassette transfer region 406. Rotational cross robot 407 is adapted to position cassettes in and remove cassettes from reactors 401, 402 and vacuum load locks 403, 404 by vertical motion along vertical path 407A. Rotational cross robot 407 is further adapted to rotatably swap two processing cassettes containing processed substrates with two processing cassettes containing unprocessed substrates.

Components of system 400 that are substantially the same in organization and operation as the corresponding components of system 200 include FI 102, transfer robot 405, reactors 401, 402, facilities towers 130A, 130B, overhead rack 140, and the process fluid delivery system. As with system 100, a FOUP stocker may be positioned over load stations 104A-C to provide local storage of FOUP's or other substrate transport pods during batch processing of substrates.

In operation, processing cassettes located in loadlocks 403, 404 are loaded with substrates from load stations 104A-C with transfer robot 405. Vacuum-tight door 156 closes and loadlocks 403, 404 are evacuated to the same level of vacuum present in evacuated transfer region 406. Gate valve 420 opens and the processing cassettes are lowered into evacuated transfer region 406 by rotational cross robot 407. Rotational cross robot 407 then rotates 180°, positioning the processing cassettes under reactors 401, 402. Gate valve 421 opens and rotational cross robot 407 loads the processing cassettes into reactors 401, 402, gate valve 421 closes, and ALD or CVD processing may be performed on the substrates contained in the processing cassettes. After processing in reactors 401, 402 is complete, rotational cross robot 407 returns the processing cassettes to load locks 403, 404 by a similar process of lowering, rotating, and lifting. Load locks 403, 404 are vented to atmospheric pressure and, once sufficiently cooled, are transferred to one or more FOUP's positioned on load stations 104A-C.

In a preferred sequence, two processing cassettes are processed in reactors 401, 402 at the same time that two processing cassettes in load locks 403, 404 are being loaded with unprocessed substrates. In this way, cassettes containing unprocessed substrates are loaded and pumped down while the reactors are processing two other cassettes. In addition, cassettes containing freshly processed substrates are vented to atmosphere, cooled, and unloaded while the reactors are processing other cassettes. Hence, reactor idle time is reduced to a few seconds, i.e., the time necessary for the rotational cross robot 407 to lower, rotate and raise the processing cassettes.

Atmospheric Rotary Table Configuration

Figure 5:
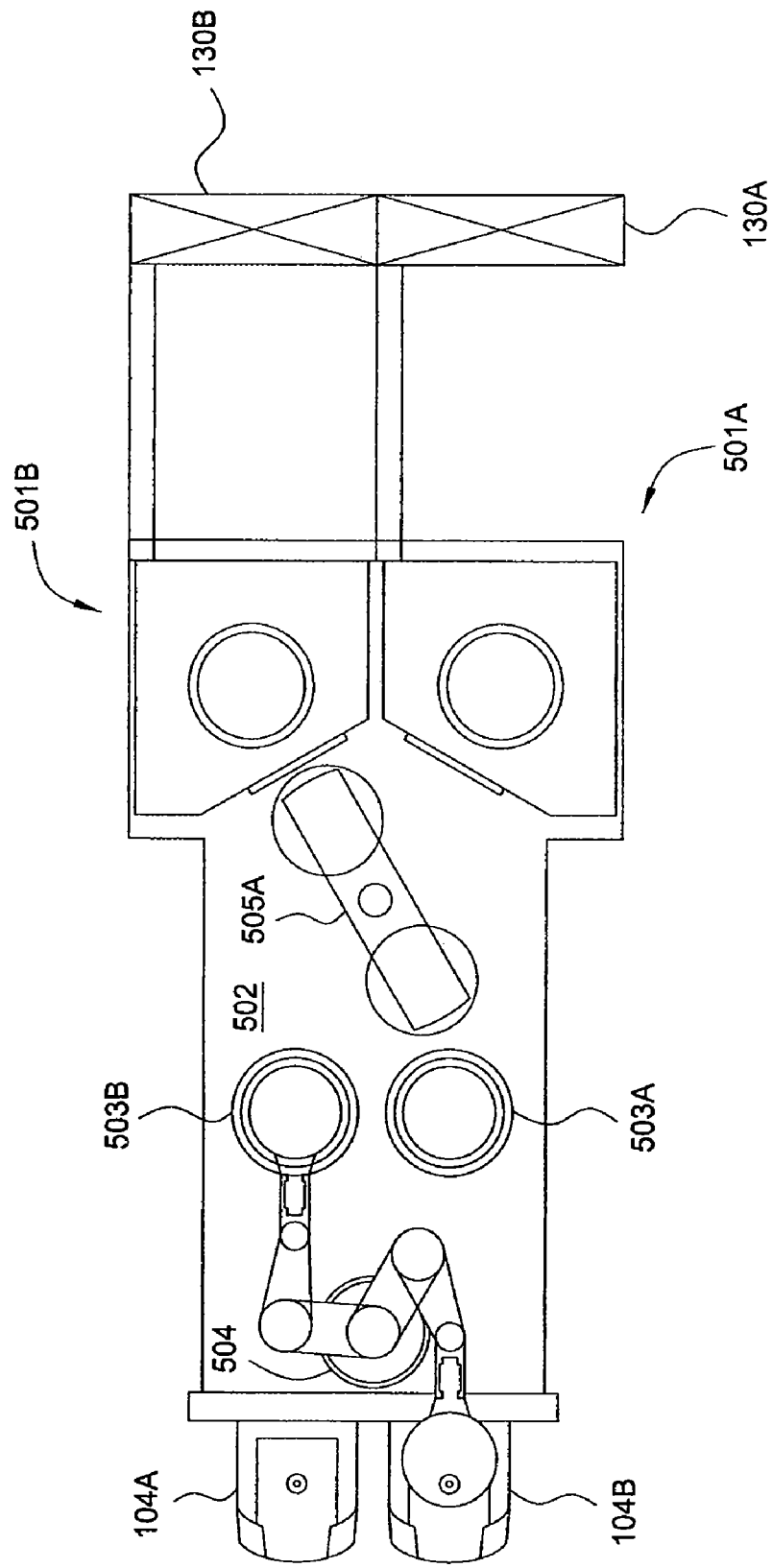
FIG. 5 is a schematic plan view of a batch processing platform.

FIG. 5 is a schematic plan view of one aspect of the invention, a batch processing platform, hereinafter referred to as system 500, wherein a rotary table with a linear horizontal motion transfers processing cassettes between two staging platforms and two batch processing stations.

An important component of the COO of a substrate processing platform is downtime related to planned and unplanned maintenance. Hence, a processing platform may have a relatively high nominal throughput, i.e., substrates processed per hour, but if it suffers from substantially higher downtime compared to other systems, it may effectively have a long-term throughput, i.e., substrates processed per month, that is much lower than other systems. To that end, having fewer robots that perform less complex motions is a beneficial feature of a processing platform. The configuration illustrated in FIG. 5 has this feature.

System 500 includes two batch processing stations, 501A, 501B, an atmospheric transfer region 502, two staging platforms 503A, 503B, a single transfer robot 504, a processing fluid delivery system, and a rotary table 505A adapted to transfer processing cassettes rotationally and with a linear horizontal motion. The atmospheric transfer region 502 is similar in organization and operation to FI 102, described above in conjunction with FIG. 1C, and contains transfer robot 504, one or more load stations 104A-B, and an environmental control assembly (not shown for clarity). Batch processing stations, 501A, 501B are similar in organization and operation to batch processing stations 101A, 101B, described above in conjunction with FIGS. 1A, 1B. An important difference is that staging platforms 503A, 503B are not positioned adjacent batch processing stations 501A, 501B, respectively. In stead, processing cassettes are transferred between staging platforms 503A, 503B and the buffer chambers contained in batch processing stations 501A, 501B. The processing cassettes are loaded horizontally into buffer chamber via a horizontal motion radially by rotary table 505A. Transfer robot 504 is substantially the same single track-mounted robot as transfer robot 220, described above in conjunction with FIGS. 2A-C. Transfer robot 504 may be stationary, however, reducing the cost and complexity of transfer robot 504 as well as improving the reliability thereof. Due to the difference in substrate between a typical FOUP and a processing cassette, transfer robot is preferably equipped with only single blade robot arms, which further reduces the complexity and cost of transfer robot 504.

Other components of system 500 that are substantially the same in organization and operation as the corresponding components of systems 200 include facilities towers 130A, 130B, overhead rack 140, and the process fluid delivery system. As with systems 100, 200, a FOUP stocker may be positioned over load stations 104AB to provide local storage of FOUP's or other substrate transport pods during batch processing of substrates.

In operation, processing cassettes located on staging platforms 503A, 503B may be loaded with unprocessed substrates by transfer robot 504. Staging platforms 503A, 503B may further serve as cooling stations for freshly processed substrates. Rotary table 505A is adapted to remove a processing cassette loaded with unprocessed substrates using a horizontal actuator and a small Z-motion. Rotary table 505A then rotates as necessary to position the processing cassette of unprocessed substrates adjacent an idle batch processing station. After processing, rotary table 505A returns cassettes to staging platforms 503A, 503B for cooling, unloading, and reloading with unprocessed substrates.

In a preferred sequence, substrate cooling and loading/unloading operations are performed while batch processing stations 501A, 501B are processing substrates. A first processing cassette is positioned on a staging platform, for example staging platform 503A, and loaded with substrates while a batch processing station, for example batch processing station 501A, is processing substrates in a second processing cassette. Prior to the completion of processing in batch processing station 501A, rotary table 505A removes the first processing cassette from staging platform 503A. Once processing is completed on the second processing cassette, rotary table 505A removes the second processing cassette from batch processing station 501A, rotates 180° C., and places the first processing cassette into batch processing station 501A. Rotary table 505A then positions the second processing cassette on an available staging platform 503A, 503B for cooling and subsequent unloading. In this way, batch processing station 501A is only idle for a matter of seconds, i.e. the time necessary for rotary table 505A to remove a cassette, rotate 180° C., and position a second cassette in a batch processing station. In addition, the configuration illustrated in FIG. 5 has fewer and/or simpler robots than other configurations of batch processing platform.

In one configuration, staging platforms 503A, 503B are capable of sufficient vertical motion to accommodate the transfer of substrates and/or processing cassettes thereon. This configuration further simplifies the design of rotary table 505A, increasing the reliability thereof.

While the foregoing is directed to embodiments of the present invention, other and further embodiments of the invention may be devised without departing from the basic scope thereof, and the scope thereof is determined by the claims that follow.

What is claimed is:

1. A substrate processing apparatus, comprising:
   a substrate processing chamber;
   a processing cassette that is adapted to support two or more substrates;
   a cassette handler robot adapted to transfer the processing cassette between a staging platform and the substrate processing chamber, wherein the cassette handler robot is adapted to contain a lift mechanism;
   a substrate transfer robot that is adapted to transfer substrates between a substrate transport pod and the processing cassette using multiple substrate handling blades;
   a cassette transfer region in which the staging platform is disposed that is generally maintained at a pressure below atmospheric pressure;
   a first load lock that is adapted to support the transfer of the processing cassette from a region of atmospheric pressure to the cassette transfer region
   a second load lock; and,
   a second substrate processing chamber, wherein the cassette handler robot comprises a rotary table adapted to:
      rotatably position a processing cassette under each load lock and under each processing chamber;
      vertically transfer two processing cassettes between the processing chambers and the cassette transfer region; and
      vertically transfer two processing cassettes between the load locks and the cassette transfer region.

2. A substrate processing apparatus, comprising:
   a substrate processing chamber;
   a processing cassette that is adapted to support two or more substrates;
   a cassette handler robot adapted to transfer the processing cassette between a staging platform and the substrate processing chamber, wherein the cassette handler robot is adapted to contain a lift mechanism;
   a substrate transfer robot that is adapted to transfer substrates between a substrate transport pod and the processing cassette, the substrate transfer robot having one robot arm configured with five substrate handling blades;
   a cassette transfer region in which the staging platform is disposed that is generally maintained at a pressure below atmospheric pressure;
   a first load lock that is adapted to support the transfer of the processing cassette from a region of atmospheric pressure to the cassette transfer region
   a second load lock; and
   a second substrate processing chamber, wherein the cassette handler robot comprises a rotary table adapted to:
      rotatably position a processing cassette under each load lock and under each processing chamber;
      vertically transfer two processing cassettes between the processing chambers and the cassette transfer region; and
      vertically transfer two processing cassettes between the load locks and the cassette transfer region.

* * * * *

UNITED STATES PATENT AND TRADEMARK OFFICE
CERTIFICATE OF CORRECTION

| | | |
|---|---|---|
| PATENT NO. | : 7,833,351 B2 | Page 1 of 1 |
| APPLICATION NO. | : 11/426563 | |
| DATED | : November 16, 2010 | |
| INVENTOR(S) | : Webb et al. | |

It is certified that error appears in the above-identified patent and that said Letters Patent is hereby corrected as shown below:

Column 4, Line 22, please delete "110A" and insert --101A-- therefor.

Signed and Sealed this
Fifteenth Day of March, 2011

David J. Kappos
*Director of the United States Patent and Trademark Office*